(12) United States Patent
Raftery et al.

(10) Patent No.: US 6,958,609 B2
(45) Date of Patent: Oct. 25, 2005

(54) NUCLEAR MAGNETIC RESONANCE ANALYSIS OF MULTIPLE SAMPLES

(75) Inventors: Daniel Raftery, Lafayette, IN (US); Ernesto McNamara, Alexandria, VA (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 10/785,918

(22) Filed: Feb. 24, 2004

(65) Prior Publication Data

US 2004/0164738 A1 Aug. 26, 2004

Related U.S. Application Data

(62) Division of application No. 09/938,996, filed on Aug. 24, 2001, now Pat. No. 6,696,838, which is a continuation of application No. PCT/US00/04842, filed on Feb. 25, 2000.
(60) Provisional application No. 60/121,869, filed on Feb. 26, 1999.

(51) Int. Cl.[7] .................................................. G01V 3/00
(52) U.S. Cl. ....................... 324/321; 324/307; 324/308; 324/309
(58) Field of Search ................................ 324/321, 318, 324/322, 303, 320, 307, 300, 309, 308, 310; 435/7.1; 600/410, 423

(56) References Cited

U.S. PATENT DOCUMENTS

| | | | |
|---|---|---|---|
| 2,720,625 A | * 10/1955 | Leete | .......................... 324/300 |
| 3,443,209 A | * 5/1969 | Nelson et al. | .............. 324/320 |
| 4,633,181 A | 12/1986 | Murphy-Boesch et al. | |
| 4,654,592 A | 3/1987 | Zens | |
| 4,656,422 A | * 4/1987 | Vail et al. | ................... 324/303 |
| 4,691,162 A | 9/1987 | Van Uijen | |
| 4,742,304 A | 5/1988 | Schnall et al. | |
| 4,792,757 A | * 12/1988 | Vail et al. | ................... 324/303 |
| 4,871,969 A | 10/1989 | Roemer et al. | |
| 5,086,275 A | 2/1992 | Roemer | |
| 5,146,166 A | 9/1992 | Bartuska | |
| 5,236,239 A | 8/1993 | Govang et al. | |
| 5,237,276 A | 8/1993 | Cory | |
| 5,323,113 A | 6/1994 | Cory et al. | |
| 5,585,723 A | 12/1996 | Withers | |
| 5,654,636 A | 8/1997 | Sweedler | |
| 5,760,586 A | 6/1998 | Foerster et al. | |
| 5,818,231 A | 10/1998 | Smith | |
| 5,872,452 A | 2/1999 | Cory et al. | |
| 5,905,378 A | 5/1999 | Giaquinto et al. | |
| 5,914,599 A | 6/1999 | Sharp | |
| 5,926,023 A | 7/1999 | De Groot et al. | |
| 5,929,639 A | 7/1999 | Doty | |
| 5,986,453 A | 11/1999 | Anderson et al. | |

(Continued)

OTHER PUBLICATIONS

MacNamara et al., article: "Multiplex sample NMR: an approach to high-throughput NMR using a parallel coil probe" Analytica Chimica Acta pp. 9–16; Oct. 1999.*

(Continued)

*Primary Examiner*—Brij Shrivastav
*Assistant Examiner*—Tiffany A. Fetzner
(74) *Attorney, Agent, or Firm*—William F. Bahret

(57) ABSTRACT

A Nuclear Magnetic Resonance (NMR) probe device (20) is disclosed. NMR probe device (20) includes a plurality of detection coils (30, 40) each operable to detect a signal from a corresponding one of a plurality of samples (34, 44) undergoing NMR analysis. Also included is a plurality of tuning circuits (31, 41, 38, 48) each coupled to one of detection coils (30, 40) to tune the one of the detection coils (30, 40) to a corresponding resonant frequency for the NMR analysis of the corresponding one of the samples. An electromagnetic shield (22) is positioned between a first one of the detection coils (30, 40) and a second one of the detection coils (30, 40) to isolate the first one of the detection coils (30, 40) and the second one of the detection coils (30, 40) from each other.

19 Claims, 27 Drawing Sheets

U.S. PATENT DOCUMENTS

| | | | | | |
|---|---|---|---|---|---|
| 6,100,687 | A | * | 8/2000 | Weitekamp et al. | 324/300 |
| 6,147,492 | A | * | 11/2000 | Zhang et al. | 324/309 |
| 6,166,541 | A | * | 12/2000 | Smith et al. | 324/300 |
| 6,229,308 | B1 | * | 5/2001 | Freedman | 324/303 |
| 6,392,408 | B1 | * | 5/2002 | Barrall et al. | 324/300 |
| 6,504,368 | B2 | * | 1/2003 | Ross et al. | 324/307 |
| 6,781,373 | B2 | * | 8/2004 | Gurr | 324/300 |
| 2001/0024796 | A1 | * | 9/2001 | Selifonov et al. | 435/7.1 |
| 2001/0045831 | A1 | * | 11/2001 | Ross et al. | 324/307 |
| 2002/0130661 | A1 | * | 9/2002 | Raftery et al. | 324/318 |
| 2004/0100259 | A1 | * | 5/2004 | Gurr | 324/307 |

OTHER PUBLICATIONS

Banes article ""Multi–Cloistered" NMR cells" Applied Spectroscopy vol. 23 pp. 281–282, Nov. 3, 1969.*

James S. Hyde, A Jesmanowicz, W. Froncisz, J. Bruce Kneeland, Thomas M. Grist, and Nicholas F. Campagna; "Parallel Image Acquisition from Noninteracting Local Coils"; Journal of Magnetic Resonance; Milwaukee, Wisconsin; Aug. 8, 1986.

Nian Wu, Timothy L. Peck, Andrew G. Webb, Richard L. Magin, and Jonathan V. Sweedler; "$^1H$–NMR Spectroscopy on the Nanoliter Scale for Static and On–Line Measurements"; Analytical Chemistry, vol. 66, No. 22; University of Illinois at Champaign–Urbana, Illinois; Nov. 15, 1994.

Dean L. Olson, Timothy L. Peck, Andrew G. Webb, Richard L. Magin and Jonathan V. Sweedler; High–Resolution Microcoil $^1H$–NMR for Mass–Limited, Nanoliter–Volume Samples; Science, vol. 270; Dec. 1995.

Ting Hou, Ernesto MacNamara, and Daniel Raftery; "NMR Analysis of Multiple Samples Using Parallel Coils: Improved Performance Using Reference Deconvolution and Multidimensional Methods"; Analytica Chimica Acta 20174; Aug. 1999.

Y. Li, A.M. Wolters, P.V. Malawey, J.V. Sweedler, and A.G. Webb; "Multiple Solenoidal Microcoil Probes for HighSensitivity, High–Throughput Nuclea Magnetic Resonance Spectroscopy," Analytical Chemistry, vol. 71, Nov. 1, 1999.

Walton, J. H., et al., "Probe Tuning Adjustments—Need They Be in the Probe?," Journal of Magnetic Resonance, vol. 81, 1989, pp. 623–627.

MacLaughlin, D.E. "Coaxial Cable Attenuation in NMR Sample Coil Circuits," Rev. Sci. Instrum., vol. 60, No. 10, Oct. 1989, pp. 3242–3248.

Conradi, Mark S. "Low–Temperature NMR Techniques," Concepts in Magnetic Resonance, vol. 5, 1993, pp. 243–262.

Fisher, Gregory, et al., "NMR Probe for the Simultaneous Acquisition of Multiple Samples," Journal of Magnetic Resonance, vol. 138, 1999, pp. 160–163.

Peck, Timothy L., et al., "Design and Analysis of Microcoils for NMR Microscopy," Journal of Magnetic Resonance, Series B, vol. 108, 1995, pp. 114–124.

Wu, Nian, et al., "Nanoliter Volume Sample Cells for H NMR: Application to On–Line Detection in Capillary Electrophoresis," Am. Chem Soc., vol. 116, No. 17, 1994, pp. 7929–7930.

Hurd, Ralph E., "Gradient–Enhanced Spectroscopy," Journal of Magnetic Resonance, vol. 87, 1990, pp. 422–428.

Haw, James F., et al., "Analysis of Coal Conversion Recycle Solvents by Liquid Chromatography with Nuclear Magnetic Resonance Detection," Analytical Chemistry, vol. 53, No. 14, Dec. 1981, pp. 2332–2336.

Schlotterbeck, Götz, et al., "Direct On–Line Coupling of Capillary HPLC with $^1H$ NMR Spectroscopy for the Structural Determination of Retinyl Acetate Dimers: 2D NMR Spectroscopy in the Nanoliter Scale," Analytical Chemistry, vol. 69, No. 7, Apr. 1, 1997, pp. 1421–1425.

Stevenson, S., et al., "$^{13}C$ Dynamic Nuclear Polarization: A Detector for Continuous–Flow, On–Line Chromatography," Analytical Chemistry, vol. 66, No. 19, Oct. 1, 1994, pp. 2993–2999.

Wu, Nian, et al., "On–Line NMR Detection of Amino Acids and Peptides on Microbore LC," Analytical Chemistry, vol. 67, No. 18, Sep. 15, 1995, pp. 3101–3107.

Bayer, Ernst et al., "On–Line Coupling of Liquid Chromatography and High–Field Nuclear Magnetic Resonance Spectrometry," Analytical Chemistry, vol. 54, No. 11, Sep. 1982, pp. 1747–1750.

Behnke, Beate, et al., "Capillary HPLC—NMR Coupling: High–Resolution $^1H$ NMR Spectroscopy in the Nanoliter Scale," Analytical Chemistry, vol. 68, No. 7, Apr. 1, 1996, pp. 1110–1115.

Webb, A.G., et al., "Signal–to–Noise and Magnetic Susceptibility Trade–offs in Solenoidal Microcoils for NMR," Journal of Magnetic Resonance, Series B, vol. 113, 1996, pp. 83–87.

Rogers, John A., et al., "Using Microcontact Printing to Fabricate Microcoils on Capillaries for High Resolution Proton Nuclear Magnetic Resonance on Nanoliter Volumes," Appl. Phys. Lett., vol. 70, No. 18, May 5, 1997, pp. 2464–2466.

Subramanian, R., et al., "RF Microcoil Design for Practical NMR of Mass–Limited Samples," Journal of Magnetic Resonance, vol. 133, 1998, pp. 227–231.

Olson, Dean L., et al., "High–Resolution Microcoil NMR for Analysis of Mass–Limited, Nanoliter Samples," Analytical Chemsitry, vol. 70, No. 3, Feb. 1, 1998, pp. 645–650.

Smallcombe, Stephen H., et al., WET Solvent Suppression and Its Applications to LC NMR and High–Resolution NMR Spectroscopy, Journal of Magnetic Resonance, Series A, vol. 117, 1995, pp. 295–303.

Albert, Klaus, "On–Line Use of NMR Detection in Separation Chemistry," Journal of Chromatography A, vol. 703, 1995, pp. 123–147.

Webb, Andrew G., "Radiofrequency Microcoils in Magnetic Resonance," Progress in Nuclear Magnetic Resonance Spectroscopy, vol. 31, 1997, pp. 1–42.

Albert, Klaus, "Supercritical Fluid Chromatography—Proton Nuclear Magnetic Resonance Spectroscopy Coupling," Journal of Chromatography A, vol. 785, 1997, pp. 65–83.

Barbara, Thomas M., "Cylindrical Demagnetization Fields and Microprobe Design in High–Resolution NMR," Journal of Magnetic Resonance, Series A, No. 109, 1994, pp. 265–269.

Shoolery, J.N., "Small Coils for NMR Microsamples," Topics in Carbon–13 NMR Spectroscopy, Wiley–Interscience Publication, John Wiley & Sons, 1979, vol. 3, Section III, pp. 28–38.

Kim, Y.W., et al., "Cryogenic Probe with Low–Loss Transmission Line for Nuclear Magnetic Resonance," Journal of Magnetic Resonance, Series A, vol. 116, 1995,pp. 139–144.

Albert, Klaus, et al., "High–Performance Liquid Chromatograph Proton Nuclear Magnetic Resonance On–Line Coupling," HPLC Detection: Newer Methods, VCH, New York, 1992, Ch. 9, pp. 197–229.

Ross, Alfred, et al., "Application of Chemical Shift Imaging for Simultaneous and Fast Acquisition of NMR Spectra on Multiple Samples," *Angew. Chem. Int. Ed.*, vol. 40, No. 17, 2001, pp. 3243–3245.

Lacey, Michael E., et al., "High–Resolution NMR Spectroscopy of Sample Volumes From 1 nL to 10 µL," *Chemical Reviews*, vol. 99, No. 10, 1999, pp. 3133–3152.

Oldfield, Eric, "A Multiple–Probe Strategy for Ultra–High-Field Nuclear Magnetic Resonance Spectroscopy," *Journal of Magnetic Resonance*, Series A, No. 107, 1994, pp. 255–257.

Lam, Kit S., et al., "The 'One–Bead–One–Compound' Combinatorial Library Method," *Chemical Reviews*, vol. 97, No. 2, 1997, pp. 411–448.

Ellman, Jonathan, et al., "Combinatorial Thinking in Chemistry and Biology," *Proc. Natl. Acad. Sci. USA*, vol. 94, Apr. 1997, pp. 2779–2782.

Hsieh–Wilson, Linda C., et al., "Lessons From the Immune System: From Catalysis to Materials Science," *Acc. Chem. Res.*, vol. 29, No. 3, 1996, pp. 164–170.

Xiang, X.–D et al., "A Combinatorial Approach to Materials Discovery," *Science*, vol. 268, Jun. 23, 1995, pp. 1738–1740.

Ueno, Kyoji, et al., "Simultaneous Monitoring of DNA Fragments Separated by Electrophoresis in a Multiplexed Array of 100 Capillaries," *Analytical Chemistry*, vol. 66, No. 9, May 1, 1994, pp. 1424–1431.

Asano, Keiji G., et al., "Parallel Monitoring for Multiple Targeted Compounds by Ion Trap Mass Spectrometry," *Analytical Chemistry*, vol. 67, No. 17, Sep. 1, 1995, pp. 2739–2742.

Stonehouse, Jonathan, et al., "Ultrahigh–Quality NOE Spectra," *J. Am. Chem. Soc.*, vol. 116, No. 13, 1994, pp. 6037–6038.

Shuker, Suzanne B., et al., "Discovery High–Affinity Ligands for Proteins: SAR by NMR," *Science*, vol. 274, Nov. 29, 1996, pp. 1531–1534.

Hajduk, Philip J., "One–Dimensional Relaxation– and Diffusion–Edited NMR Methods for Screening Compounds That Bind to Macromolecules," *J. Am. Chem. Soc.*, vol. 119, No. 50, 1997, pp. 12257–12261.

* cited by examiner

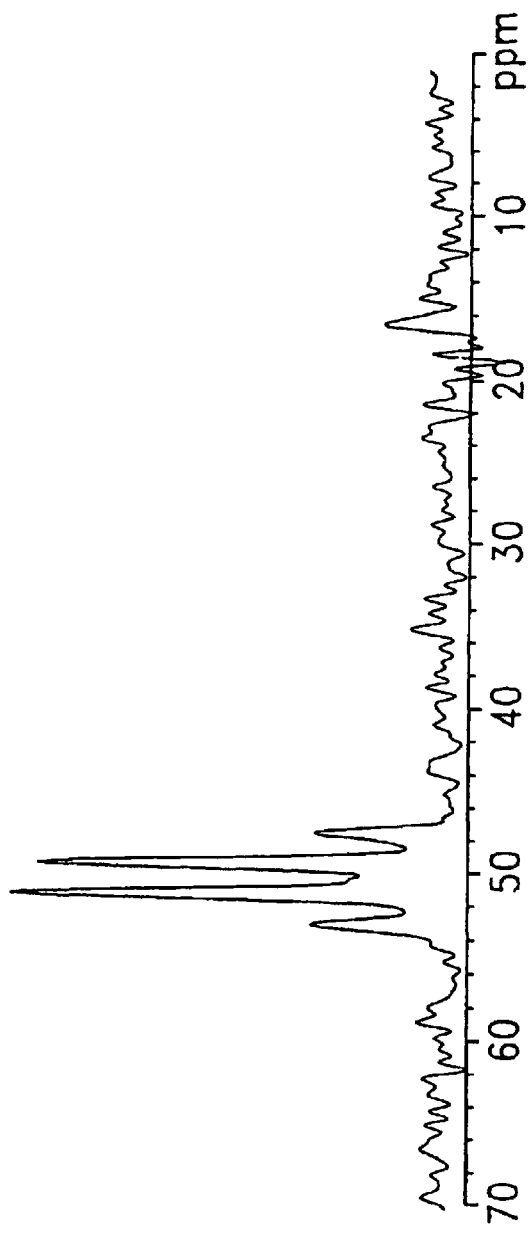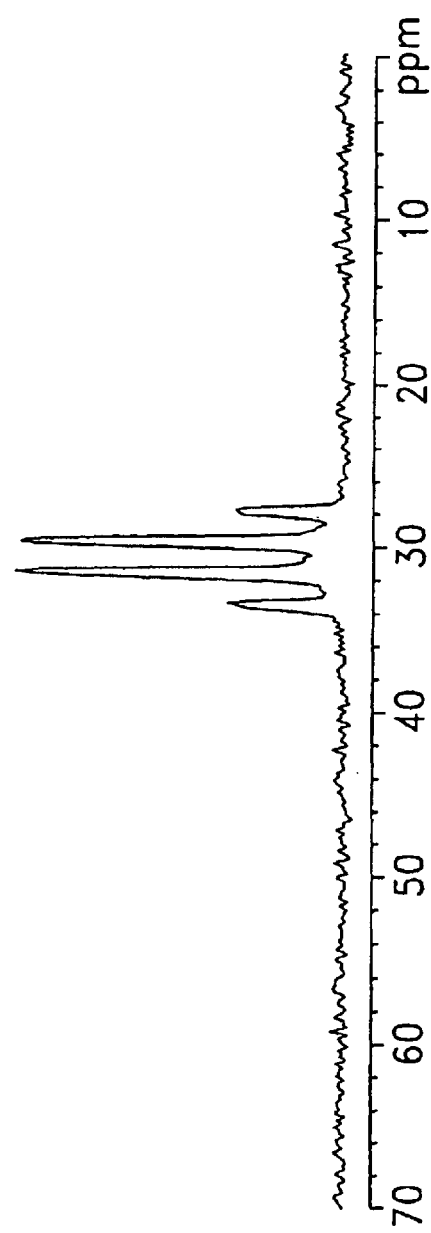

NUCLEAR MAGNETIC RESONANCE ANALYSIS OF MULTIPLE SAMPLES

CROSS-REFERENCE TO RELATED APPLICATIONS

The present application is a division of apllication Ser. No. 09/936,996, filed Aug. 24, 2001, now U.S. Pat. No. 6,696,838, which is a continuation of application No. PCT/US00/04842, filed Feb. 25, 2000; which claims the benifit of provisional patent application No. 60/121,869, filed Feb. 26, 1999, which is hereby incorporated by reference.

GOVERNMENT RIGHTS

The U.S. Government has a paid-up license in this invention and the right in limited circumstances to require the patent owner to license others on reasonable terms as provided for by the terms of the National Science Foundation (NSF) grant number CHE 95-31693 under contract number 500-1393-3104.

BACKGROUND

The present invention relates to analysis of materials based on Nuclear Magnetic Resonance (NMR), and more particularly, but not exclusively, the NMR analysis of multiple samples.

Atomic nuclei with an odd atomic mass or an odd atomic number possess a nuclear magnetic moment. NMR methods are based on the absorption and re-emission of radio frequency waves by a sample in a magnetic field that have atoms with this nuclear make-up. By way of nonlimiting example, molecules including $^1H$, $^{13}C$, $^{19}F$, or $^{31}P$ may be analyzed using NMR techniques to provide fast, molecule-specific qualitative and quantitative information. Such molecules exhibit resonant frequencies that are sensitive to the molecular chemical environment, making NMR a useful molecular probe. However, existing NMR equipment is generally unable to satisfactorily analyze more than one sample at a time, and correspondingly limits sample evaluation throughput. To provide for more efficient use of NMR resources, techniques to increase sample throughput would be desirable.

SUMMARY

One form of the present invention includes a unique system to perform NMR evaluation on more than one sample at a time. Alternatively or additionally, another form of the present invention includes a unique technique to perform NMR analysis of multiple samples simultaneously.

A further form of the present invention includes NMR instrumentation comprising a probe with a plurality of coils each configured to receive a different sample. The coils each include a tuning circuit. These turning circuits may be located external to the NMR magnet and may be electrically shielded from one another to reduce unwanted interactions.

In another form, a technique of the present invention includes providing an NMR probe with multiple coils each arranged to receive a corresponding one of a plurality of samples. The coils may each be tuned separate from the others to provide for simultaneous evaluation of the samples. The coils may each be coupled to a tuning circuit having a variable element that is adjusted to perform the tuning operation. For each tuning circuit, the coil may be coupled to the variable element by a transmission line to provide for remotely locating the variable element outside of the NMR magnetic field while the coil remains in this field.

In one embodiment, the tuning circuit includes two variable capacitor elements remotely located relative to the coil by a transmission line coupling, and another two fixed or variable capacitors coupled either in parallel or series, or both, in the NMR magnet before the transmission line coupling to the tuning circuit.

In yet another form, an NMR probe is provided that includes a number of coils each configured to receive a different sample. This probe may be incorporated into standard NMR equipment with only minor modifications to facilitate the simultaneous detection of multiple samples. For example, the probe may be arranged to fit into a conventional NMR magnet housing and use a common NMR transmitter amplifier for excitation of multiple samples.

Other forms of the present invention include a multicoil NMR probe arranged for operation in a magnetic field with a predetermined gradient. This gradient is used to differentiate multiple samples. The data from multiple coils in the graded field may be received by a single receiver and analyzed using one or more procedures to provide the desired differentiation. In one embodiment, a two dimensional representation of the data is created to better differentiate the samples.

Further forms, embodiments, advantages, benefits, aspects, and objects of the present invention shall become apparent from the description and figures provided herein.

BRIEF DESCRIPTION OF THE DRAWINGS

FIGS. 3 and 4 are diagrams of proton coupled $^{13}C$ NMR spectra obtained with the system of FIG. 1 for methanol and acetone, respectively. Both spectra were acquired using a single 90 degree pulse and the same 50 kHz spectral widths. J couplings evident in the spectra are 138 Hz for methanol and 140 Hz for acetone.

DESCRIPTION OF PREFERRED EMBODIMENTS

Figure 1:
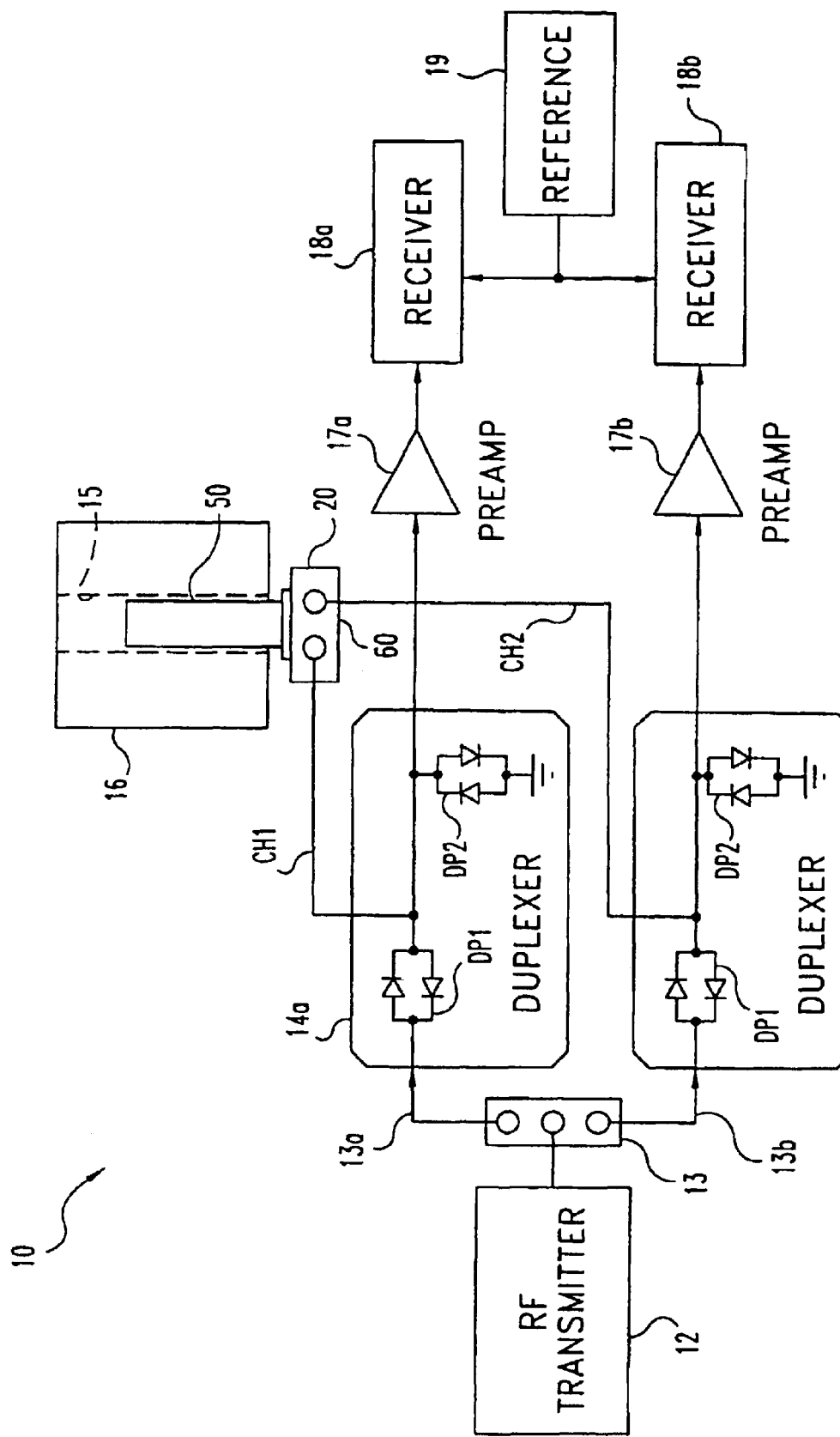
FIG. 1 is a partial schematic view of a NMR system of one embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

FIG. 1 schematically illustrates Nuclear Magnetic Resonance (NMR) system 10 of one embodiment of the present invention. Instrumentation of system 10 includes Radio Frequency (RF) transmitter 12 coupled to power splitter 13. Power splitter 13 has two outputs 13a, 13b coupled to duplexers 14a, 14b, respectively. Each duplexer 14a, 14b is operably coupled to a corresponding probe channel CH1, CH2. Duplexers 14a, 14b pass high-power level RF signals from RF transmitter 12 to probe device 20 via channels CH1, CH2.

Figure 2:
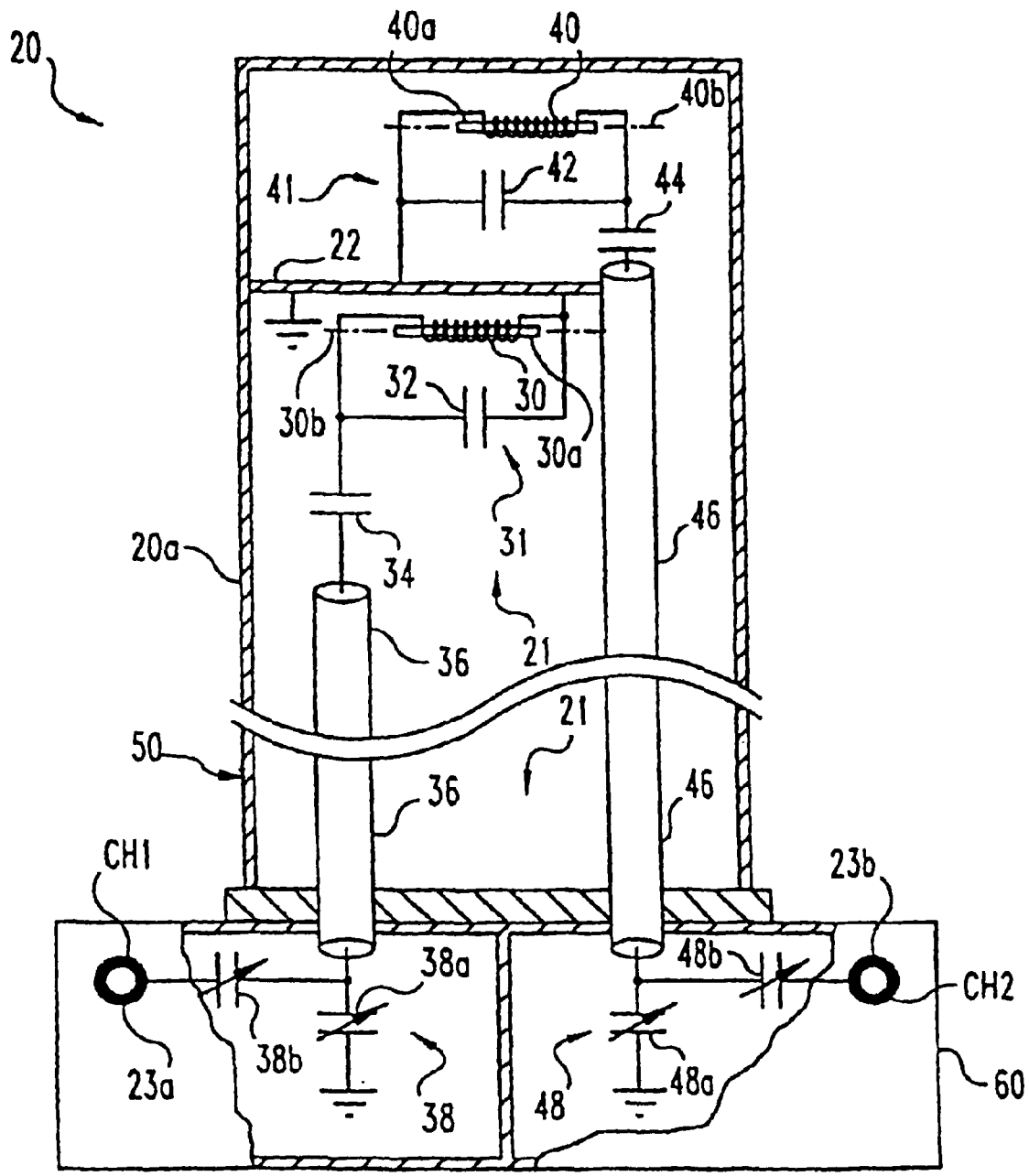
FIG. 2 is a partial sectional and schematic view of a probe device for the system of FIG. 1.

Probe device 20 is removably positioned in sample space 15 of NMR magnet 16. Probe device 20 is configured to place two samples in sample space 15 for simultaneous NMR analysis. Referring additionally to FIG. 2, probe device 20 includes housing 20a that defines probe head 50 opposite base 60. Two detection coils 30, 40 are disposed within probe head 50. Coils 30, 40 are each disposed about a corresponding sample holder 30a, 40a. Sample holders 30a, 40a are each arranged to hold a different sample, and maintain the samples spatially separated from one another within probe head 50. In one embodiment, coils 30, 40 are each provided in the form of a helical winding (alternatively designated a "solenoid" configuration herein) about a glass tube which serves as the corresponding sample holder 30a, 40a. In other embodiments, coil 30 and/or coil 40 can be of a different type, including, but not limited to a saddle or bird cage coil geometry, and holders 30a, 40a can be configured for another container type and/or composition. U.S. Pat. No. 4,654,592 to Zens; U.S. Pat. No. 5,323,113 to Cory, et al.; and U.S. Pat. No. 5,929,639 to Doty provide a few nonlimiting illustrations of various types of coil geometry.

Probe device 20 includes channel circuitry 21 to independently couple each coil 30, 40 to a different connector 23a, 23b in base 60 in correspondence with probe channels CH1, CH2, respectively. In other embodiments, probe device 20 includes additional coils with corresponding channel circuitry and connectors to provide more than two probe channels. Accordingly, for such embodiments, more than two samples can be submitted for simultaneous NMR analysis.

Probe device 20 further includes grounding plane 22 coupled to housing 20a and channel circuitry 21. Grounding plane 22 is positioned between coils 30,40 to reduce intercoil cross-talk. Grounding plane 22 is in the form of a plate comprised of copper that has a thickness suitable to operate as shielding to electromagnetically decouple coils 30,40 from each other. In other embodiments, grounding plane 22 may be of a different form or composition, and/or an electromagnetic shield may be provided in a different manner. In still other embodiments, grounding plane 22 and/or an electromagnetic shield may be absent.

Circuitry 21 includes fixed tuning networks 31, 41 disposed within probe head 50. Fixed tuning networks 31, 41 are electrically coupled to coils 30, 40, respectively, and each belong to a different probe channel CH1, CH2. Fixed tuning networks 31, 41 include capacitive elements 32, 42 electrically connected in parallel with coils 30, 40, respectively. Tuning network 31 includes capacitive element 34 electrically connected in series with the parallel circuit coil 30 and capacitive element 32. Tuning network 41 includes capacitive element 44 electrically connected in series with the parallel circuit of coil 40 and capacitive element 42.

Circuitry 21 also includes coaxial transmission lines 36, 46 and adjustable tuning networks 38, 48. Fixed tuning networks 31, 41 are electrically connected to the inner conductor of coaxial transmission lines 36, 46, respectively. Transmission lines 36, 46 interconnect fixed tuning networks 31, 41 in probe head 50 with adjustable tuning networks 38, 48 disposed in base 60 of probe device 20. Adjustable tuning networks 38, 48 include adjustable capacitive elements 38a, 48a electrically connected between the inner conductor termination of transmission line 36, 46 in base 60 and ground. Adjustable tuning networks 38, 48 also include adjustable capacitive elements 38b, 48b between connectors 23a, 23b and the termination of the inner conductor of transmission lines 36, 46, respectively.

System 10 further includes preamps 17a, 17b; receivers 18a, 18b; and reference frequency source 19. Probe channels CH1, CH2 are each electrically connected to a corresponding preamp 17a, 17b and NMR receiver 18a, 18b. Receivers 18a, 18b are electrically coupled to reference frequency source 19 in a standard manner. Fixed tuning networks 31, 41 and adjustable tuning networks 38, 48 are arranged to tune to a resonant frequency for NMR analysis of a nucleus type common to each of the samples held in coils 30, 40. During exposure to the magnetic field generated by NMR magnet 16, a suitable RF signal from transmitter 12 delivered to each coil 30, 40 excites the corresponding samples. Duplexers 14a, 14b are arranged to route the RF excitation to channels CH1, CH2 through crossed diode pair DP1 while preamps 17a, 17b are blanked to present a high input impedance. Crossed diode pair DP2 associated with each channel CH1, CH2 provides further circuit isolation and protection. Typically, RF excitation is in the form of a common 90 degree pulse; however, other interrogation techniques may alternatively or additionally be utilized as would occur to those skilled in the art.

After excitation, coils 30, 40 are also used to detect a response for the sample contained in its corresponding sample holder 30a, 40a. This response is provided by each coil 30, 40 as an electrical signal along the corresponding channel CH1, CH2. Preamps 17a, 17b are activated to receive the response signals from channels CH1, CH2 via duplexers 14a, 14b for processing by NMR receivers 18a, 18b in the usual manner.

Placement of adjustable tuning networks 38, 48 in base 60 provides for easy accessibility and a reduction in the volume and complexity of probe head 50. The separate tuning networks 38, 48 allow each coil 30, 40 to be tuned independently to the desired resonant frequency. Typically, for each channel CH1 and CH2, this resonant frequency is selected to interrogate the same nucleus type. Fixed networks 31, 41 provide coarse tuning and reduce power losses that would otherwise occur in transmission lines 36, 46. Fine adjustment of the tuning and matching of probe circuit is accomplished by adjusting the pair of tunable capacitors 38a, 48a and 38b, 48b in each corresponding network 38, 48. Isolation is provided by shielding of the individual coils and by appropriate grounding. In particular, ground plane 22 separates the two detection coils 30, 40 in the sample region (probe head 50), while separate compartments house each network 38, 48 at probe base 60. As a result, each circuit tunes independently and cross-talk between coils 30, 40 is reduced.

Coils 30, 40 each extend along a corresponding longitudinal axis 30b, 40b as illustrated in FIG. 2. Axes 30b, 40b are approximately parallel to each other. Alternatively or additionally, cross-talk reduction can be obtained by orienting one of the coils 30, 40 relative to another of the coils 30, 40 based on coil geometry. By way of nonlimiting example, by orienting the longitudinal axes 30a, 40a of the coils 30, 40 to cross one another at approximately right angles (90 degrees), cross-talk can generally be reduced for a saddle, solenoid, or other generally cylindrical coil configuration.

The experimentally observed spectra depicted in FIGS. 3 and 4 illustrate the type of data that may be acquired with system 10. For this experimental example, two coils were provided in the form of a 4 turn inductor of solenoid geometry wrapped from 20 gauge insulated magnet wire that were each attached to a glass tube using a common epoxy adhesive. This glass tube was about 30 mm long with about a 4 millimeter (mm) outer diameter (o.d.) and about a 2 mm inner diameter (i.d.). Each sample was placed in a sealed glass tube having about a 2 mm inner diameter and a length of about 6 mm that was positioned into a corresponding one of the larger glass tubes. A nominal 11 picofarad (pf) fixed capacitor was used for each of the parallel capacitive elements 32, 42 (American Technical Ceramics Corp., Huntington Station, N.Y.). For this embodiment, a nominal 32 picofarad (pf) capacitor was utilized for each element 34, 44 between the network 31, 41 and the transmission line 36, 46, respectively; and tuning elements 38a, 38b, 48a, 48b of networks 38, 48 were provided in the form of capacitors having a nominally variable range of about 3 pf to about 11 pf (Voltronics Corporation, Denville, N.J.). The regions of the probe base containing the variable capacitors were electronically isolated from one another. It was observed that the coils did not exhibit coupling due to mutual inductance when tuned and matched to the same resonant frequency; thereby allowing different samples to be monitored using a single NMR spectrometer.

For FIGS. 3 and 4, spectral data was acquired at about 7.4 Tesla and both spectra were acquired at the same time in response to a single 90 degree RF pulse from the RF transmitter operating at a frequency of 75.44 MHz (corresponding to 75.440 MHz for $^{13}$C). In this example, the two spectra were acquired on two separate NMR receivers. The transmitted RF excitation pulse was split through the power splitter (Model ZSC-2-1W, Mini-Circuits, Brooklyn N.Y.), and each output from the power splitter was routed through crossed diodes (to reduce amplifier noise) and subsequent, independent duplexer/preamp stages. The crossed diode pairs DP1, DP2 also improved signal isolation, reducing interference during data acquisition. The receivers were phased locked using a 10 MHz reference signal from the Varian spectrometer. Simultaneous data acquisition was accomplished by using Analog-to-Digital (A/D) conversion.

In FIGS. 3 and 4, $^{13}$C NMR spectra of the two different samples each representing a single analyte compound were acquired at the same time in separate, discrete detection coils. In one coil, a sample of about 4 $\mu$l of acetone, isotopically enriched to 99% at the methyl position was detected (FIG. 4). In the other coil, a sample of $^{13}$C enriched methanol (also 99%) of similar size was detected (FIG. 3). Enriched compounds were used to enhance the signal to noise ratio for preliminary investigations, however, the observed mass-limited sensitivity was better than that typically achieved in standard NMR probes and is in line with the sensitivity of small microcoils in general. Both spectra of FIGS. 3 and 4 were acquired with the same 50 kHz spectral widths. J couplings evident in the spectra are 138 Hz for methanol and 140 Hz for acetone.

Figure 5:
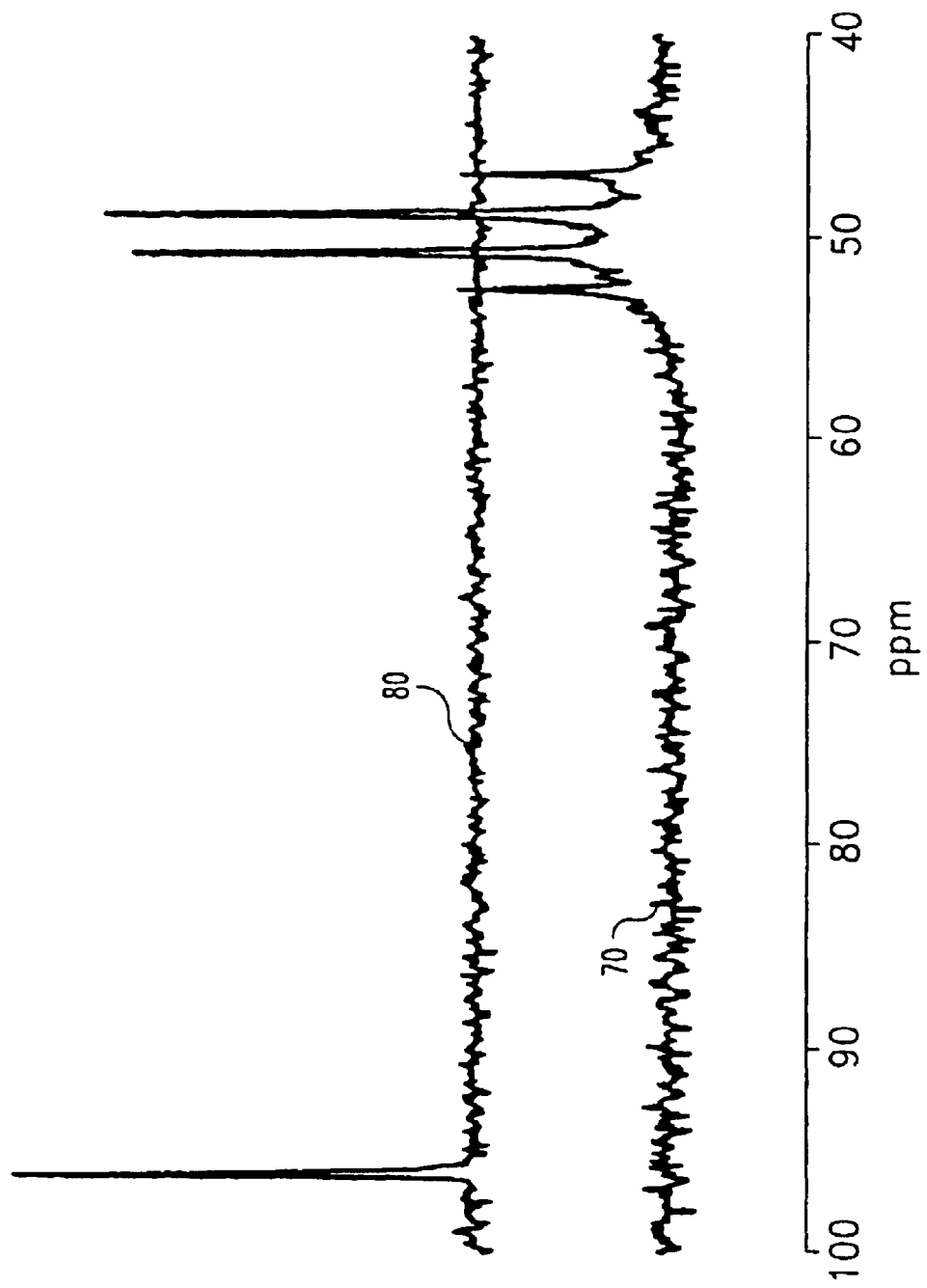
FIG. 5 depicts $^{13}C$ NMR spectra for methanol and carbon tetrachloride using the system of FIG. 1.

Referring next to the experimental example corresponding to the spectra of FIG. 5, the same experimental set-up was used as that described for the spectra of FIGS. 3 and 4. In FIG. 5, 4 $\mu$l samples of methanol ($^{13}$C, 99%) and carbon tetrachloride ($^{13}$C, 99%) were evaluated corresponding to spectra 70, 80. Each spectrum 70, 80 is the result of a single acquisition using a 10 $\mu$s, 90 degree pulse and a transmitter power of about 3 watts measured at the output of RF transmitter 12. Spectrum 70 shows the proton spin-coupled $^{13}$C-methanol quartet at 50.3 ppm relative to TMS. The J-coupling is 141 Hz and the line width is approximately 9.2 Hz Full Width Half Maximum (FWHM). Spectrum 80 shows a $^{13}$C singlet from carbon tetrachloride at 96 ppm relative to TMS, with a line width of approximately 10.7 Hz (FWHM). No evidence of cross talk was present in the spectra, even after signal averaging (100 averages, not shown) was performed, to better than 1 percent of the signal intensity.

In an alternative embodiment of system 10, a single receiver may be utilized that is switched between channels CH1 and CH2 to acquire data. Correspondingly, a single computer can be used to operate the spectrometer and to acquire the signals from different samples by using a multichannel analog to digital (A/D) converter. The selected frequencies of the transmitter and receiver may vary according the particular application as would occur to those skilled in the art. Further, the RF transmitter, duplexers, receivers, and associated connections of system 10 may otherwise be arranged as would occur to those skilled in the art without departing from the spirit of the present invention. In other embodiments, other coil types and geometries may be utilized, and/or the coils may be differently sized in alternative embodiments, including the microcoil variety. As used herein, a "microcoil" has a maximum diameter of no more than about 1 millimeter (mm). In still other embodiments, more than two samples may be evaluated simultaneously in the same NMR probe by adding coils suitably decoupled by appropriate ground planes, shielding, and/or coil orientations, with corresponding tuning circuitry, duplexers, associated connections, and (optionally) receivers in accordance with the teachings of the present invention. Alternatively or additionally, RF excitation may be provided to each sample from a different source than the detection coil, such as a dedicated excitation coil.

Figure 6:
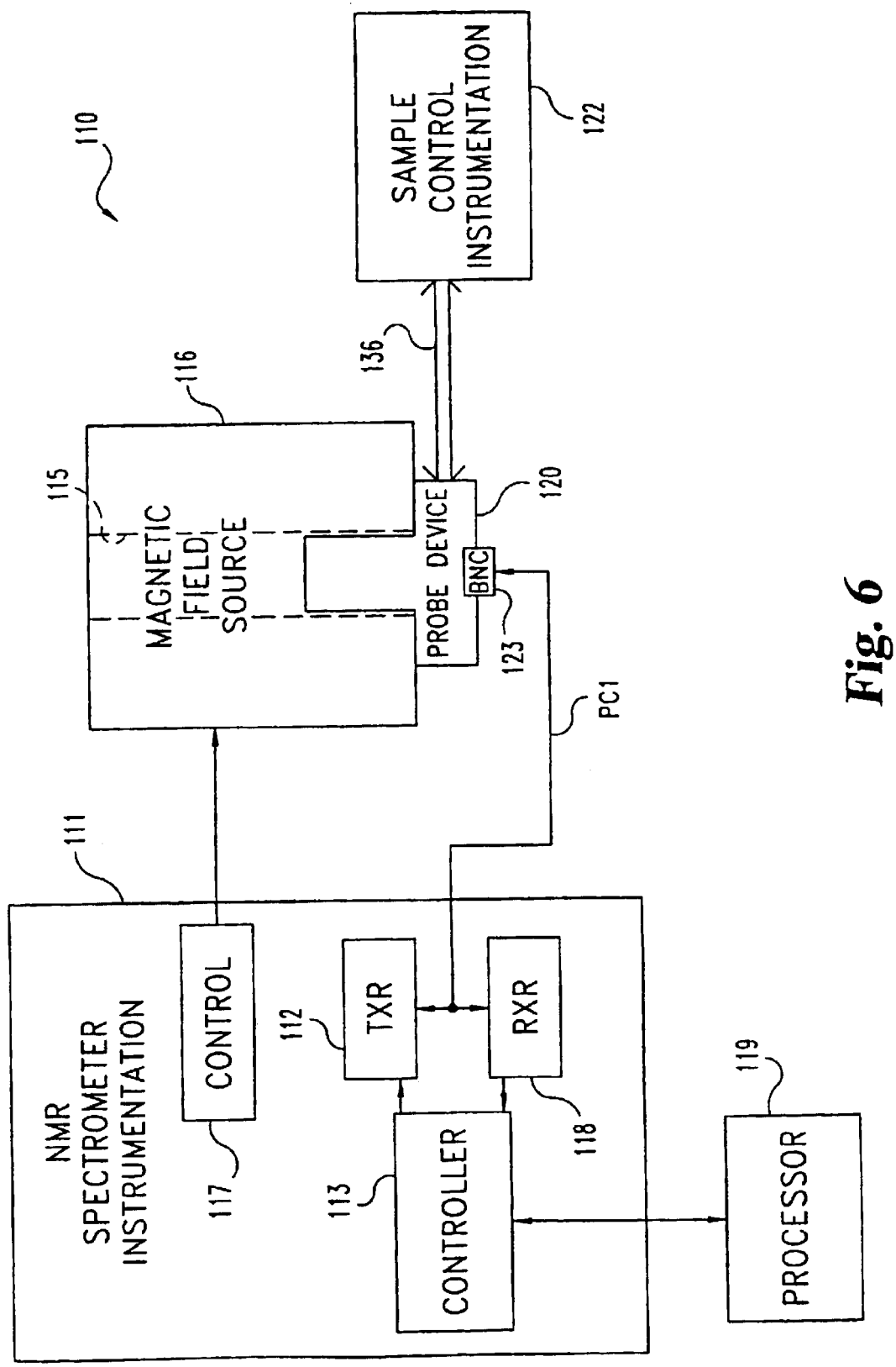
FIG. 6 is a partial schematic view of a NMR system of another embodiment of the present invention.

FIG. 6 illustrates system 110 of another embodiment of the present invention. For system 110, multiple samples are differentiated by applying a magnetic field gradient. When a magnetic field with a gradient component is applied, samples in different regions of space experience different magnetic fields. A spatially dependent frequency offset is introduced by the magnetic field gradient that is unique to each properly positioned sample. The application of field gradients allows for the signals from multiple samples to be detected using only a single receiver. Accordingly, differentiation of spectra for multiple samples can be determined from a two dimensional representation, with the first dimension providing the spatial information and the second dimension providing spectral information. By combining this technology with NMR microcoils, a substantial number of samples, limited only by the usable region of the NMR magnetic field, can be simultaneously analyzed.

System 110 includes NMR spectrometer instrumentation 111 operatively coupled to processor 119 and removable probe device 120. As depicted in FIG. 6, probe device 120 is disposed in sample space 115 of NMR magnetic field source device 116. Furthermore, probe device 120 is coupled to sample control instrumentation 122. NMR spectrometer instrumentation 111 includes a controllable RF transmitter 112 and NMR receiver 118 commonly coupled to probe device 120 by probe channel PC1. NMR spectrometer instrumentation 111 also includes controller 113 to control the operations of RF transmitter 112 and receiver 118 and to provide an interface with processor 119.

Processor 119 and the constituents of instrumentation 111 (such as transmitter 112, controller 113, and/or receiver 118) may be comprised of one or more components integrated to automatically process a number of samples. Alternatively, one or more components of system 110 may be remotely located relative to the others, and/or may be configured to optionally provide remote control of NMR processing with system 110. In one embodiment, processor 119 is in the form of a desktop Personal Computer (PC) programmed to perform the various indicated operations, and includes various input devices, such as a keyboard and/or mouse; and various output devices, such as a graphic display, printer, and/or plotter. For this embodiment, instrumentation 111 is in the form of a standard NMR spectrometer that provides spectral data to processor 119 by portable disk and/or a hardwired interface.

Instrumentation 111 also includes magnetic field adjustment control 117. Control 117 is operatively coupled to magnetic field source 116 to regulate homogeneity of the magnetic field generated in sample space 115 and selectively introduce one or more field gradients along a selected direction and/or of a selected magnitude in sample space 115. Control 117 can be an integral part instrumentation 111, can be in the form of one or more separate operator-adjustable devices attached to magnetic field source device 116, a combination of these, or such other arrangement as would occur to those skilled in the art.

Figure 7:
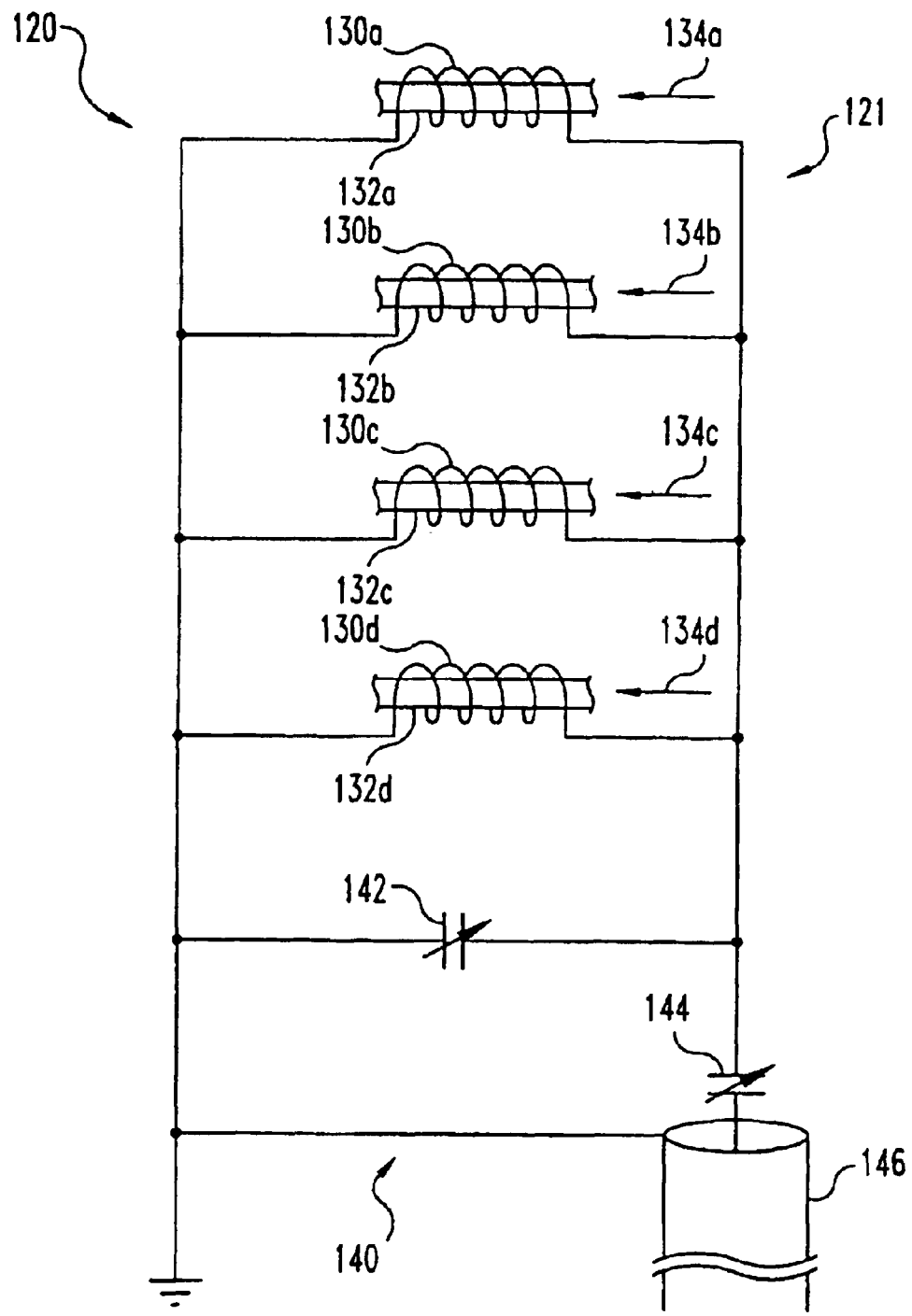
FIG. 7 is a partial schematic view of a probe device for the system of FIG. 6.

Referring additionally to FIG. 7, further details of probe device 120 are illustrated. Probe device 120 includes probe circuitry 121 with four excitation/detection coils 130a, 130b, 130c, 130d (collectively designated detection coils 130) electrically connected in parallel. Each coil 130 is of a solenoid geometry. In one embodiment, one or more of coils 130 are formed using the techniques described in D. L. Olson. T. L. Peck. A. G. Webb R. L. Mazin and J. V. Sweedler. *Science*, 270 (1995) 1967, and A. G. Webb and S. C. Grant. J. Magn, *Reson.B*. 113 (1996) 83, which are hereby incorporated by reference. In other embodiments, a different coil geometry such as a saddle or bird cage type, may be utilized for one or more of coils 130. Each coil 130a, 130b, 130c, 130d is disposed about a sample holder 132a, 132b, 132c, 132d (collectively designated sample holders 132), respectively. Each sample holder 132 is in the form of a tube that is open at opposing ends and carries the corresponding coil 130.

Figure 8:
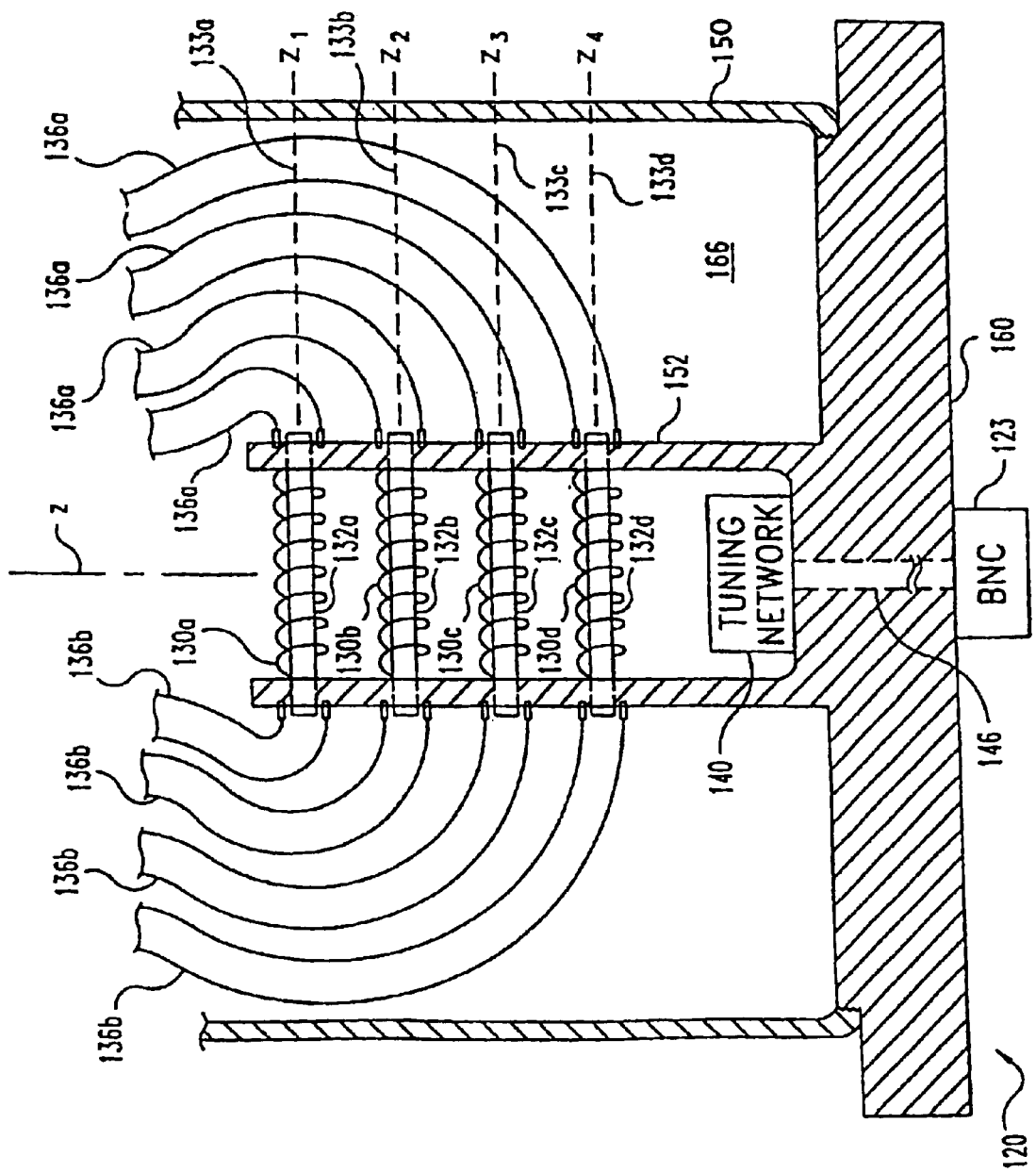
FIG. 8 is a partial sectional and schematic view of the probe device for the system of FIG. 6.

Referring also to FIG. 8, sample holders 132 are mounted in U-shaped yoke 152 connected to probe base 160. The opposing ends of sample holders 132 are each in fluid communication with a pair of sample conduits 136a, 136b (collectively designated sample conduits 136) that are connected to sample control instrumentation 122. In cooperation with sample control instrumentation 122, sample holders 132a, 132b, 132c, 132d are each arranged to selectively receive a corresponding fluent sample 134a, 134b, 134c, 134d (collectively designated samples 134). Samples 134 may be changed from time-to-time through the corresponding pair of conduits 136a, 136b without removing probe device 120 from sample space 115. Accordingly, the degree of likelihood that adjustments will need to be made between sample interrogations is reduced, potentially increasing throughput. Also, a higher throughput may be realized compared to standard NMR equipment that only tests one sample at a time. This sample delivery and exchange arrangement is also suitable for performing various complex molecular analysis techniques, including but not limited to Capillary Electrophoresis (CE), and Liquid Chromotography (LC) NMR (LC-NMR).

Probe circuitry 121 includes tuning network 140 with adjustable capacitor elements 142 and 144. Adjustable capacitor element 142 is electrically connected in parallel with coils 130. Capacitor element 144 is electrically connected between the parallel circuit of coils 130 and capacitor element 142, and the inner conductor of coaxial transmission line 146. The outer shield conductor of transmission line 146 is connected to ground along with a node common to coils 130 and capacitor element 142. As shown in FIG. 8, the opposite end of transmission line 146 terminates in a BNC connector 123 to couple with probe channel PC1 (see FIG. 6). The interconnection of tuning network 140 to coils 130 is not illustrated in FIG. 8 to preserve clarity.

Tuning network 140 provides for tuning to a resonance frequency appropriate for NMR interrogation of samples 134 and is located in adjacent probe base 160 at the bottom of yoke 152. Probe base 160 is threaded to receive a threaded housing 150. When threaded together, probe base 160 and housing 150 define fluid chamber 166. Chamber 166 is arranged to optionally receive and contain a susceptibility matching fluid to further improve resolution of spectra detected with coils 130.

Figure 9:
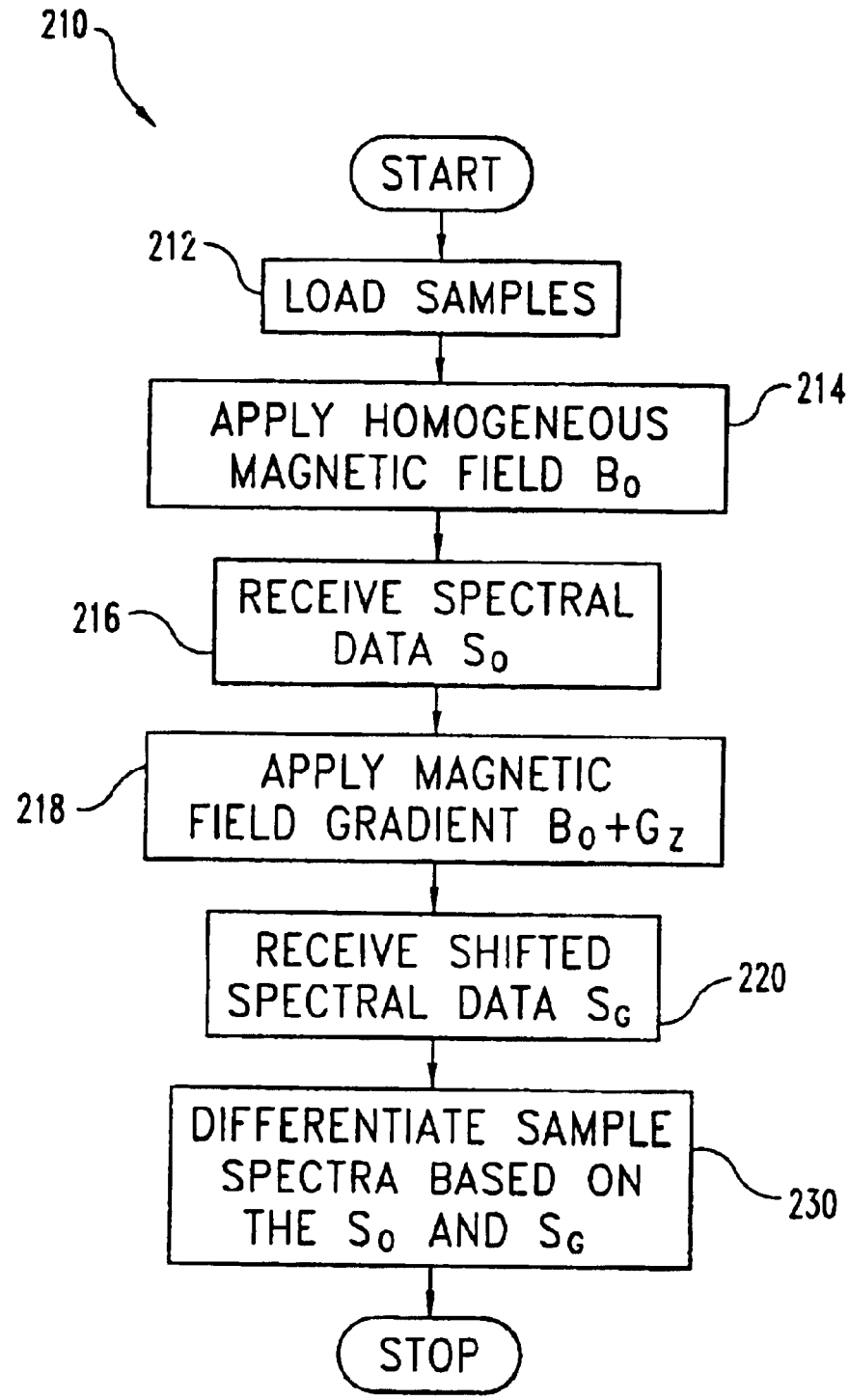
FIG. 9 is a flow chart of a process for operating the system of FIG. 6.
Figure 10:
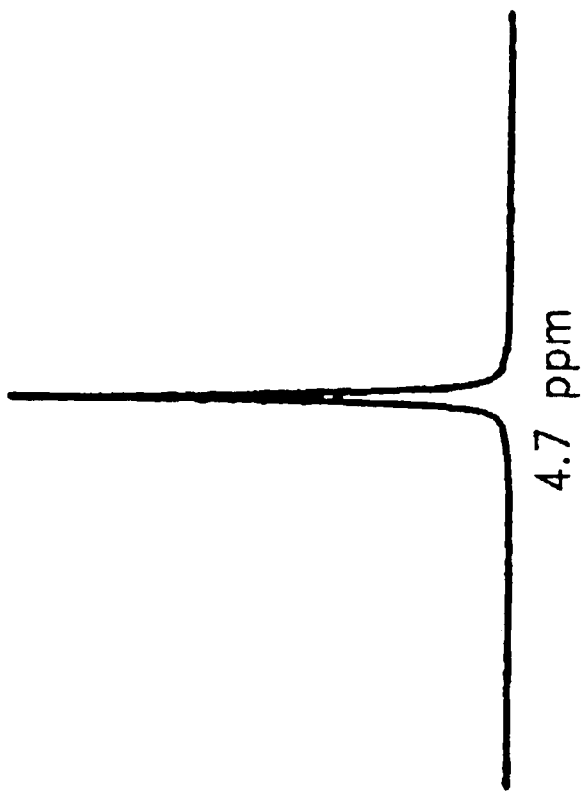
FIG. 10 is a diagram illustrating a composite NMR spectrum of multiple $H_2O/D_2O$ samples obtained with the probe device of FIG. 6 in a substantially homogeneous magnetic field.

The flow chart of FIG. 9 depicts representative stages of process 210 to perform NMR analysis of samples 134 with system 110. Process 210 starts with stage 212. In stage 212, sample control instrumentation 122 is utilized to load samples 134 into holders 132 via conduits 136a, and flush-out any previous samples via conduits 136b. After samples 134 are loaded into holders 132, a generally homogeneous magnetic field is applied in sample space 115 with magnetic source device 116 and samples 134 are excited with an appropriate RF signal from transmitter 112 via coils 130 in stage 214. During stage 214, the four regions corresponding to coils 130, holders 132, and samples 134 experience generally the same magnetic field, $B_o$. Process 210 continues with stage 216. In stage 216, the collective response of samples 134 to the RF excitation signals are detected with coils 130 and transmitted as response signals by coils 130 to receiver 118 for analysis. The corresponding spectral data $S_0$ of samples 134 is determined from the coil response signals and stored by instrumentation 111 and/or processor 119. Referring additionally to FIG. 10, a composite spectrum for an identical sample 134 of $H_2O/D_2O$ in each coil 132 of probe device 120 is illustrated. This composite spectrum has a single peak corresponding to a single resonance in the homogenous field.

In stage 218, a magnetic field gradient component is applied along a vertical axis z (see FIG. 8) that traverses samples 134 when disposed in sample space 115. When the field gradient is applied, each of the sample regions experience a field given by $B_o+G_z\times z_i$, where $G_z$ is the strength of the linear field gradient and $z_i$ is the vertical position of the i-th sample. The positions $z_1$, $z_2$, $z_3$, $z_4$, of coils 130a, 130b, 130c, and 130d along the z axis are illustrated in FIG. 8 with respect to the longitudinal centerline axis 133a, 133b, 133c, 133d of coils 130a, 130b, 130c, 130d. Correspondingly, magnetic field strength across samples 134 changes with position along the z direction and causes different amounts of frequency shift in the individual responses of samples 134. In stage 220, the frequency-shifted spectral data $S_G$ is determined from corresponding coil response signals and stored by instrumentation 111 and/or processor 119.

Figure 11:
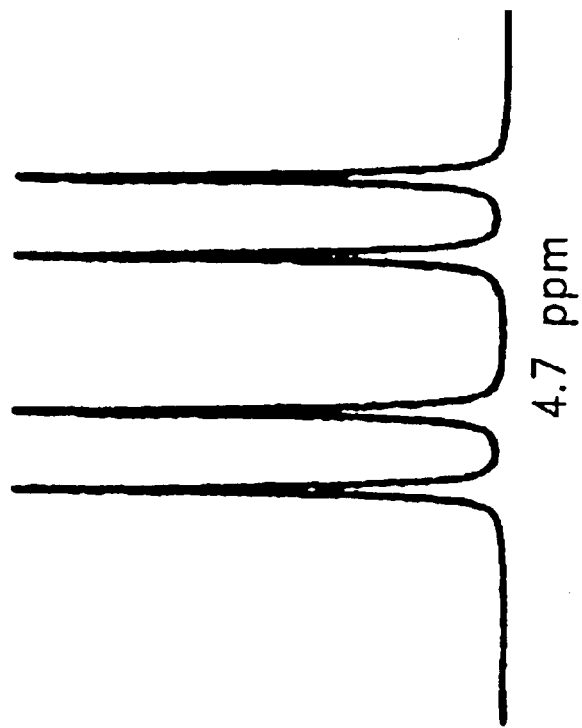
FIG. 11 is a diagram illustrating a composite NMR spectrum of the same FIG. 10 $H_2O/D_2O$ samples obtained with the probe device of FIG. 6 in a graded magnetic field.

Referring also to FIG. 11, a collective spectrum of the same samples that were the subject of the spectrum of FIG. 10 are shown; however, for FIG. 11 the applied field gradient shifts the resonance frequency of each sample 134 by a different amount relative to the single resonance of FIG. 10. Accordingly four different peaks are observed in FIG. 11. To gather the data for the spectra of FIGS. 10 and 11, probe device 20 was centered in device 116 by loading four $H_2O/D_2O$ samples and adjusting the linear gradient to separate the peaks from the individual coils. The center was chosen as the point at which the top and bottom coils were shifted in frequency by an equal and opposite amount.

Process 210 resumes with stage 230. In stage 230, the data for $S_0$ and $S_G$ is analyzed to differentiate the spectra of each sample 134 from one another using one or more various techniques, a few examples of which are as follows. Stage 230 techniques typically utilize frequency shift values associated with each coil 130/sample 134. Theses values may be determined in various ways and typically are partially or completely executed by programming of processor 119 using spectral data obtained from instrumentation 111. One procedure to determine the position-dependent frequency shifts begins with the acquisition of two spectra for a set of identical analytes having a relatively simple resonance pattern, such as the $H_2O/D_2O$ samples. The first spectrum is obtained under generally homogeneous magnetic field conditions as in the case of FIG. 10; and a second spectrum is obtained while applying a reproducible, known field gradient to the same samples as in the case of FIG. 11. The degree of frequency shift of the resonance pattern for each sample can be measured by comparing the peak patterns of the two spectra, and a corresponding set of sample region frequency shift values can be prepared for application to different samples under the same graded and ungraded magnetic field conditions.

One procedure to determine the frequency shift experienced by each coil 130 during the application of the gradient is through comparative measurements with an external standard such as water, loaded in all coils 132 under both differently graded magnetic field conditions. On occasion, this external calibration may result in small differences in local electromagnetic fields that occur because of susceptibility changes with different solvents or upon reloading probe device 120 into sample space 115. In applications where it is desirable to reduce such differences, another procedure determines frequency shifts directly from the original spectrum, $S_0$, and the frequency-shifted gradient spectrum, $S_G$, undergoing analysis. In this case, the shifts can be determined by calculating the overlap via multiplication of $S_0$ and $S_G$ in accordance with equation (1) as follows:

$$S_{overlap}(\Delta_i) = \sum_N S_0(\omega) \times S_G(\omega + \Delta_i) \quad (1)$$

where $\Delta_k$ is the frequency shift for an individual coil k, and N is the number of points in the spectrum.

Figure 12:
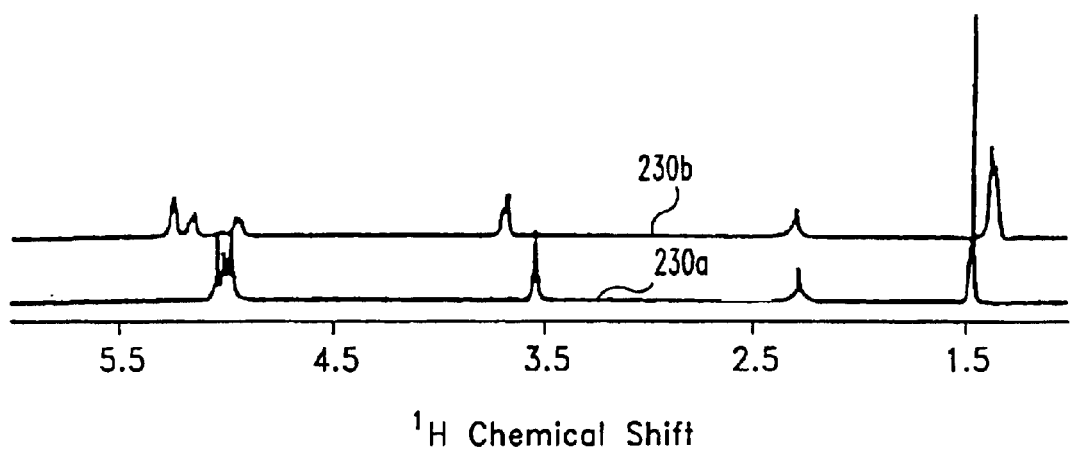
FIG. 12 depicts a first composite $^1H$ NMR spectrum for 0.5 M samples of methanol, acetonitrile, t-butanol, and water in a substantially homogeneous magnetic field, and a second composite $^1H$ NMR spectrum of these samples with a magnetic field gradient applied.

Referring to FIG. 12, an experimental NMR $^1H$ spectrum 230a is illustrated for 0.50 M samples of water ($\delta$=4.7 ppm), acetonitrile (2.0 ppm), methanol (3.3 and 4.73 ppm) and t-butanol (1.2 and 4.76 ppm) in $D_2O$ in separate coils of a four-coil probe. The spectrum of FIG. 12 was obtained without a predetermined magnetic field gradient in sample space 115 to correspond to spectrum $S_0$ obtained in stage 216. FIG. 12 also includes a frequency-shifted spectrum 230b for the same sample set as used to provide spectrum 230a. For spectrum 230b, an applied gradient of about 48 mG/cm was provided to correspond to spectrum $S_G$ obtained in stage 220. Each of the peaks in spectrum 230b shifts a different amount or in a different direction according to the position of each individual coil in the applied field gradient. The OH region is split into four lines due to contributions to this peak from each of the coils.

Figure 13:
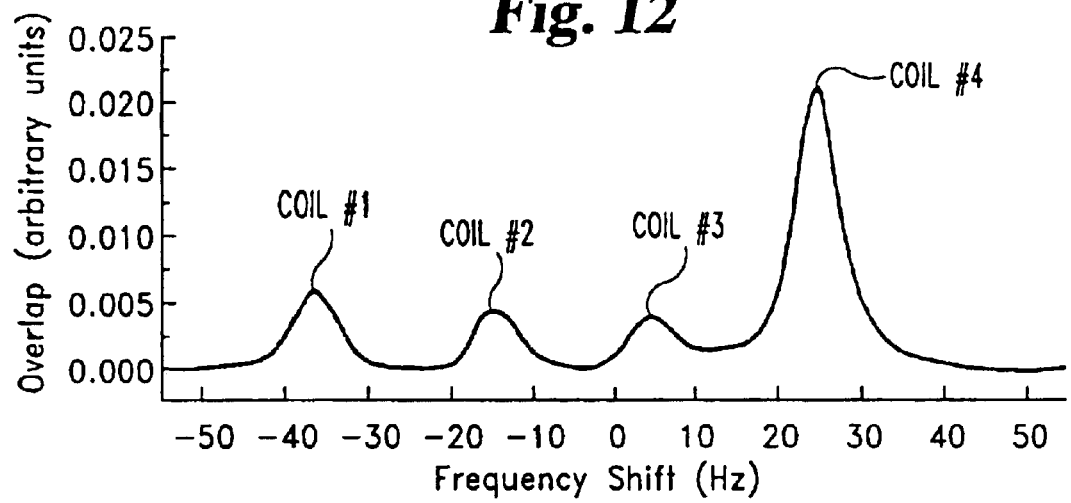
FIG. 13 depicts multiplication of the two spectra in FIG. 12 as a function of the frequency offset to determine sample region frequency shifts.

Referring to FIG. 13, an overlap plot obtained by applying equation (1) to the data for spectra 230a, 230b of FIG. 12 is illustrated. The overlap plot of FIG. 13 shows four maxima at the frequency shifts corresponding to those for the four coils. The overlap intensity is proportional to the square of the signal amplitude in each coil. The shift values obtained using this method match well with those derived from the four $H_2O/D_2O$ samples described in connection with FIGS. 10 and 11, but require only two measurements (original and shifted spectra) as opposed to four for external referencing.

Figure 14:
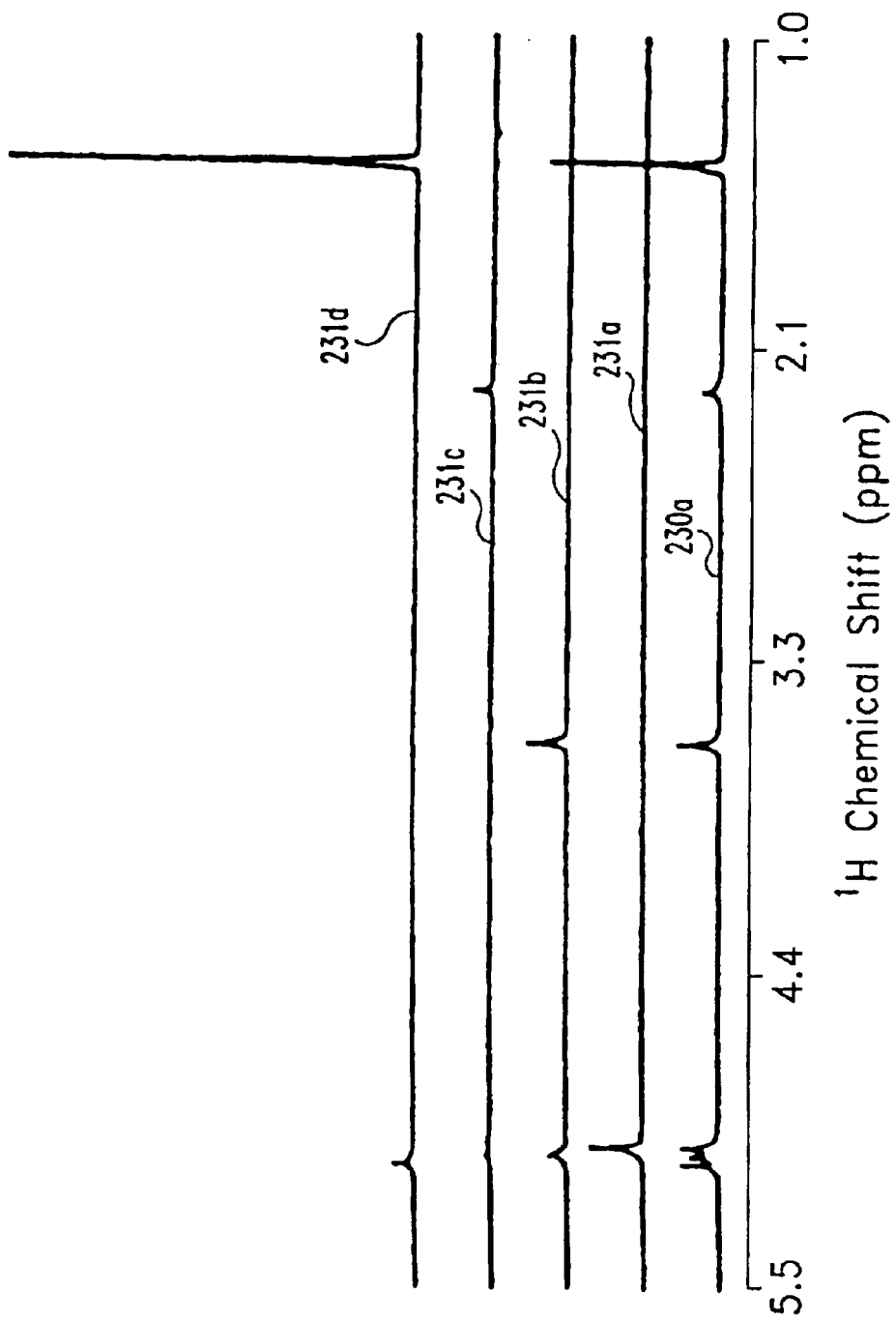
FIG. 14 depicts separated $^1$H NMR spectra of each of the samples of FIG. 12.

Once the frequency-shifts of the coils have been measured, several approaches can be implemented to assign the peaks. One technique which can be readily executed by processor 119 is to shift the gradient spectrum $S_G$ and take its product with the original spectrum $S_0$ in accordance with equation (2) as follows:

$$S^i(\omega) = S_0(\omega) \times S_G(\omega + \Delta_i) \quad (2)$$

where, $S^i$ is the spectrum generated for the ith coil and $\Delta_i$ is its corresponding frequency shift. The results of this multiplication procedure on the $S_0$ and $S_G$ spectra of FIG. 12 are shown in FIG. 14. In FIG. 14, spectrum 230a is duplicated for comparison. Also, the sub-spectra 231a, 231b, 231c, 231d are illustrated that correspond to the different water, methanol, acetonitrile, and t-butanol samples. Accurate quantitative information can be restored for this technique by taking the square of the product; however, this approach may introduce artifacts when multiplying noisy regions in the two spectra. For applications where it is desirable to reduce this possibility, then another differentiation technique may be utilized as appropriate.

Figure 15:
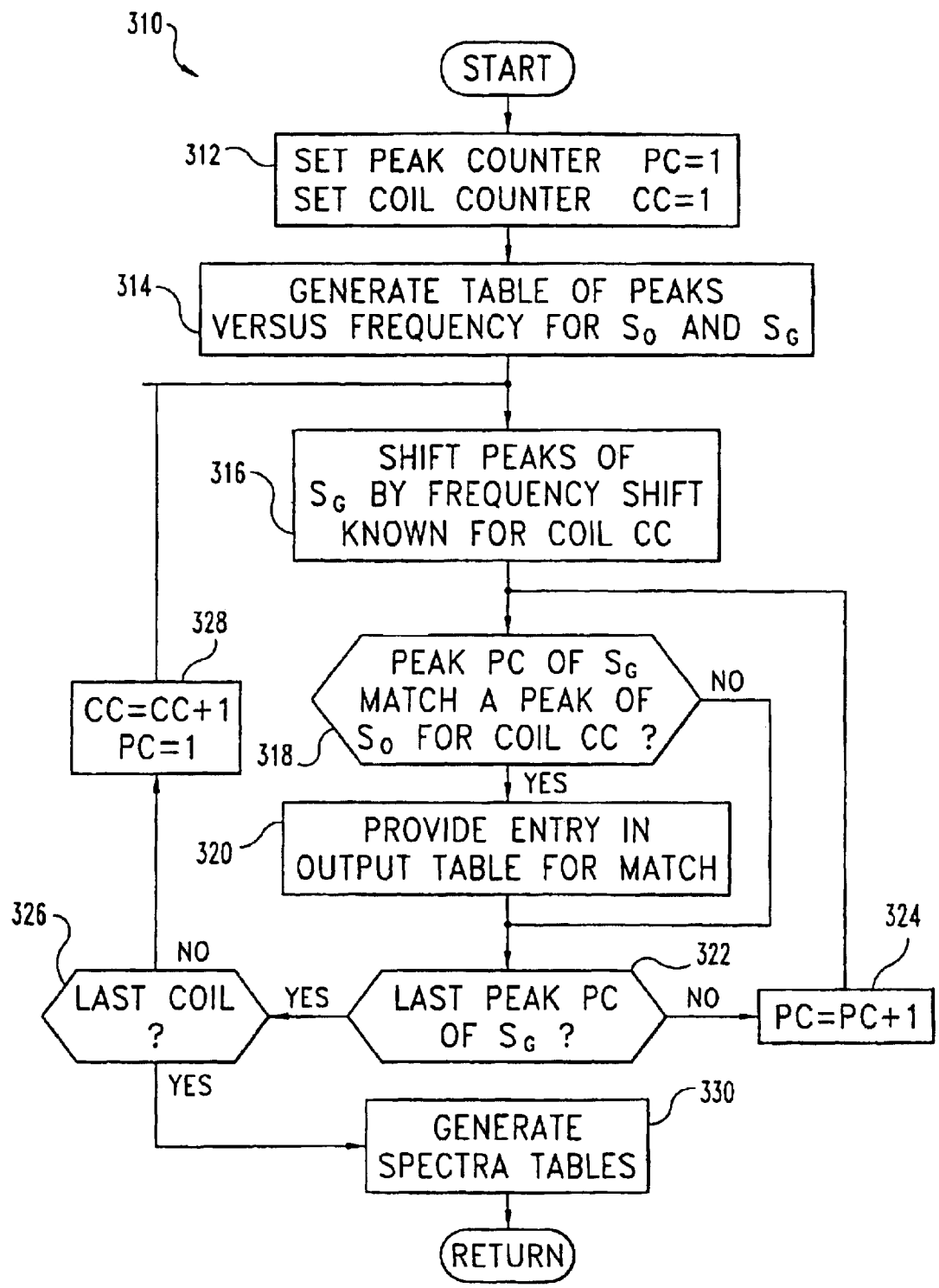
FIG. 15 is a flow chart of one procedure for determining sample-specific spectra for the process of FIG. 9.

The flow chart of FIG. 15 depicts one of the other techniques as procedure 310. As in the case of the shift identification procedure described in connection with FIGS. 12 and 13, and the multiplication technique described in connection with FIG. 14; processor 119 may be suitably programmed to execute procedure 310. Procedure 310 begins with stage 312. In stage 312, a counter PC is set to 1 (PC=1). Counter PC corresponds to a number of identified peaks determined in stage 314. A coil counter CC is also set to 1 (CC=1), that corresponds to the number of detection coils 130. Next, procedure 310 resumes with stage 314 that generates a table of the peaks versus frequency for the $S_0$ and $S_G$ spectra, then processing loop is entered beginning with stage 316. In stage 316, the spectral peaks of $S_G$ are shifted by the previously determined frequency shift for the currently indexed coil CC. Conditional 318 tests whether the indexed peak PC of the $S_G$ spectrum suitably matches a peak of the $S_0$ spectrum. If there is a tentative match, an entry is made in an output peak table in stage 320 for the given indexed coil CC. Procedure 310 resumes with conditional 322. If there is no match as determined with conditional 318, then process 310 proceeds directly from the negative branch of conditional 318 to conditional 322.

Conditional 322 tests if the indexed peak PC is the last identified peak of the $S_G$ spectrum to be analyzed. If the test of conditional 322 is negative, then procedure 310 continues with stage 324 to increment the peak counter PC to the next peak (PC=PC+1). From stage 324, process 310 loops back to execute conditional 318 for this next peak.

If the test of conditional 322 is affirmative, conditional 326 is encountered, which tests whether coil CC is the last coil. If coil CC is the last coil (CC=LAST), then procedure 310 proceeds to stage 330 to provide the spectra of the samples 134 is terms of the various entries in the output table grouped together for each different coil 130. Stage 330 may also include logic to resolve any detected ambiguities or unmatched peaks of the $S_0$ and/or $S_G$ spectra. If coil CC is not the last coil as tested by conditional 326, process 310 continues with stage 328. In stage 328, the peak counter PC is reset to 1 (PC=1) and the coil counter CC is incremented to point to the next coil (CC=CC+1). Procedure 310 then returns to stage 316 to shift the $S_G$ peaks with the frequency shift for this next coil. Stages 316, 320, 326, 328 and conditionals 318, 322, 324 are then repeated as the various conditional tests dictate until all peaks of the $S_G$ spectrum have been considered with the frequency shift of each detection coil 130. Once all these peaks are analyzed, then the previously described stage 330 is encountered to provide peak tables for each coil 130. Procedure 310 then terminates.

Experimental verification of procedure 310 was conducted. For this experimental example, four coils were wrapped from a high purity polyurethane coated 36-gauge copper wire (California Fine Wire Co. Grover Beach, Calif.) around fised silica capillaries (about 20 mm long, about a 1.6 mm outer diameter, about a 0.8 mm inner diameter) which served as both the coil form and sample holder. The inductance of each coil was approximately 20 nanohenries (nH). The coils were attached to the capillary tubes using a cyanoacrylate adhesive (Krazy Glue, Borden Inc. Columbus, Ohio). The coils were configured with four (4) turns each having an inner diameter of about 1.6 mm and a length of about 1.0 mm. The sample tubes were mounted in a PVC coil holder (corresponding to yoke 152) that held the capillary tubes with an intercoil spacing (center to center) of about 3.2 mm. The entire coil array was housed in a removable PVC container that was filled with Fluorinert FC-43 (Syn Quest Laboratories, Alachua, Fla.), a susceptibility matching fluid that has been shown to improve magnetic field homogeneity by minimizing field distortions induced by copper NMR coils. The PVC container was threaded and employed o-ring seals to prevent leakage of the Fluorinert fluid. The coil leads were connected in parallel and cut to the same length so that the resistance and inductance of each of the coils were similar. A single resonant circuit was constructed using the four parallel coils and non-magnetic tunable capacitors (Voltronics, Denville, N.J.) to tune and match the circuit. The variable capacitors were located directly beneath the sample region. With all four coils in parallel the circuit has a tuning range of ~2 MHz centered around 300 MHz and a resonant Q of about 60. The coil housing was mounted atop a narrow-bore (about 39 mm diameter) probe body and used a semi-rigid copper coaxial line to connect the resonant circuit at the top of the probe to a BNC connector at the base. To allow flow introduction of samples, teflon tubes (about 2.0 mm outer diameter, Small Parts Inc., Miami Shores, Fla.) were connected to the capillaries using polyolefin heat-shrink (Small Parts Inc., Miami Shores, Fla.) and sealed with Torr-Seal (Varian Associates, Palo Alto, Calif.). Samples were loaded using a syringe.

The probe was centered in an NMR magnet by loading four $H_2O/D_2O$ samples and adjusting the linear gradient (Z1 shim) to separate the peaks from the individual coils. The center was chosen as the point at which the top and bottom coils were shifted in frequency by an equal and opposite amount. In order to identify the NMR spectrum as originating from a particular sample volume, the external reference procedure was utilized for this experiment. Gradient field adjustments were made by changing a Z1 shim power supply control for a Z-directional gradient coil of the NMR magnet. The nongraded composite spectrum of the samples was acquired with the Z1 shim set at its optimum value, and a second spectrum was subsequently acquired with Z1 set to a value which results in a predetermined shift for each sample coil. This shift was calibrated beforehand and remained relatively constant for a given coil configuration.

Figure 16:
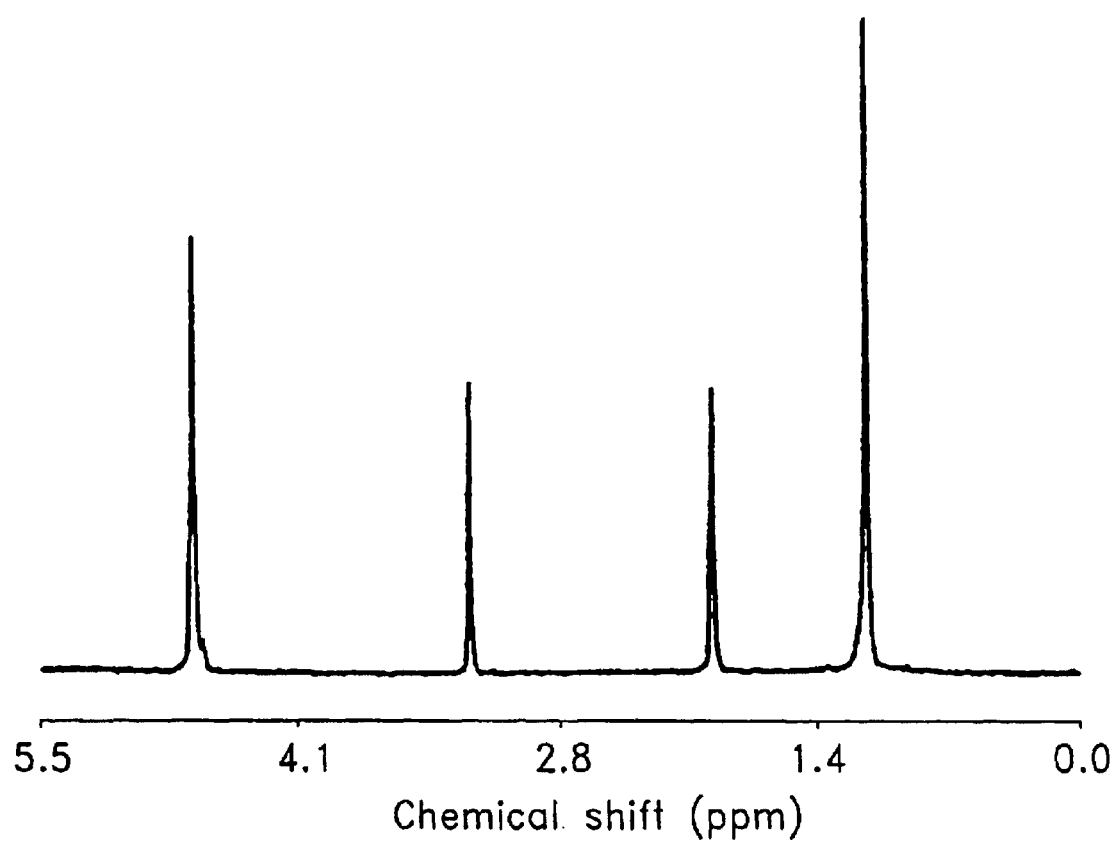
FIG. 16 depicts a composite $^1$H NMR spectrum for samples of H$_2$O, methanol, t-butanol and acetonitrile (all 500 mM in D$_2$O) acquired with the system FIG. 6 at 300 MHz.

Spectra were collected using a Varian Unity-Plus spectrometer operating at 300 MHz for $^1H$. Typically, one or four transients (with Cyclops receiver phase cycling and a recycle delay of 5 s) were accumulated for each experiment. A composite $^1$H NMR spectrum is shown in FIG. 16 for 500 mM samples of H$_2$O ($\delta$=4.7 ppm), methanol (3.2 and 4.7 ppm), acetonitrile (1.9 ppm), and t-butanol (1.1 and 4.7 ppm) in D$_2$O that had been loaded into separate coils of the flowing sample four-coil probe device. The line widths (FWHM) are, respectively, 3.1 Hz, 2.8 Hz, 3.6 Hz, and 3.4 Hz. Typical 90° pulse times were 6 $\mu$s using a transmitter power of roughly 1 W. The measured mass sensitivity, S$_m$, (defined as S/N per $\mu$mol of analyte) was 4200 for the t-butanol peak after 1 acquisition, using an apodization of 3 Hz (S$_m$=2700 for an apodization of 1 Hz). Pulse calibration data showed that the four coils have similar 90° pulse lengths and RF field homogeneity. It should be appreciated that the FIG. 12 and FIG. 16 spectra were based on the same samples. The peaks of the FIG. 16 spectrum differed slightly from the peaks of the FIG. 12 spectrum due to typical variations in equipment and field settings.

Figure 17:
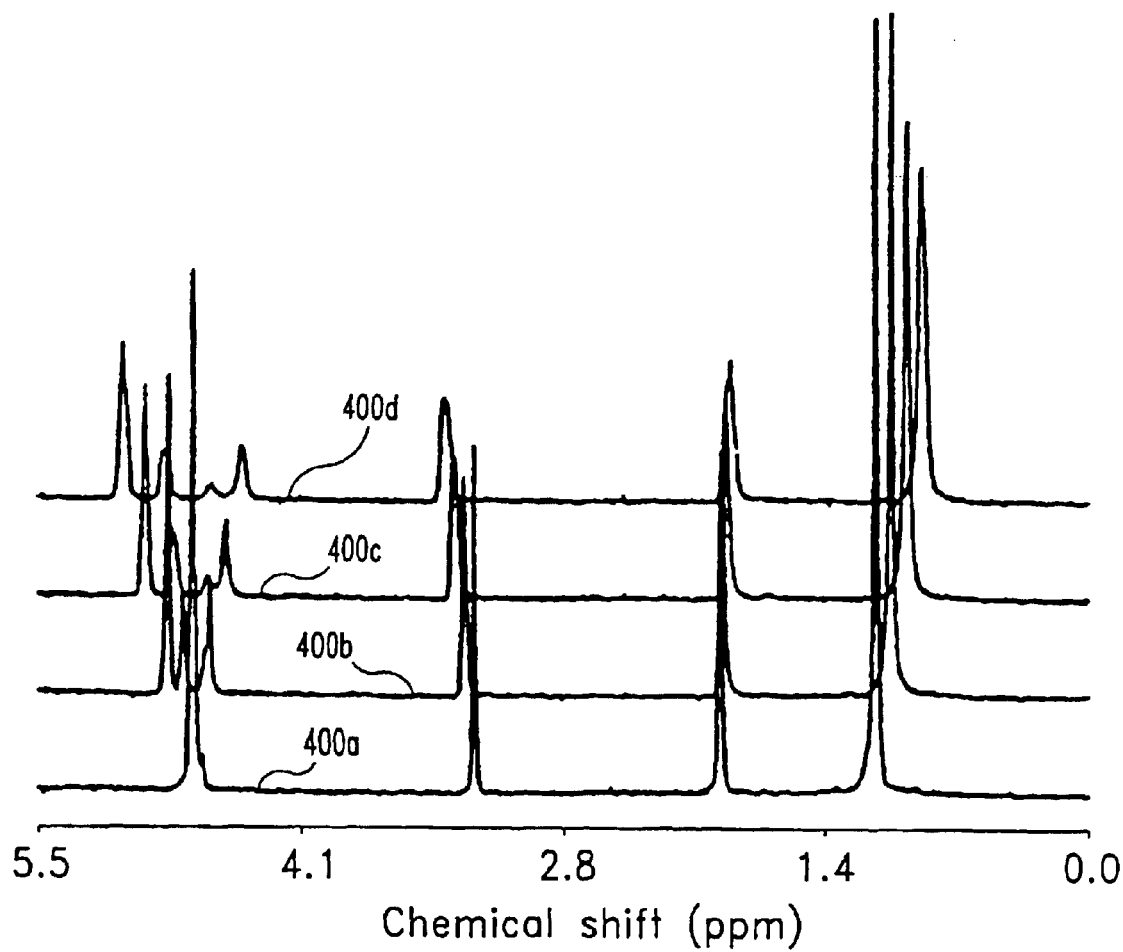
FIG. 17 depicts a series of $^1$H NMR spectra recorded with different Z1 shim values to provide different corresponding gradient strengths of 0 mG cm$^{-1}$, 12 mG cm$^{-1}$, 24 mG cm$^{-1}$, and 48 mG cm$^{-1}$, respectively, for the samples of FIG. 16.

As discussed above, upon the application of a linear field gradient, the NMR spectrum of each analyte is shifted by a value dependent on its location in a particular sample coil. The strength of the gradient was adjusted by changing the value of the first-order axial (Z1) shim setting by increments of 1000 (out of a possible ±32,000), corresponding to an increase of the field gradient strength of roughly 12 mG cm$^{-1}$ per increment. FIG. 17 shows a series of $^1$H spectra obtained with the coils loaded with same four samples as for FIG. 16, but now recorded with different values of the applied field gradient. In FIG. 17, spectrum 400a is the same as the spectrum of FIG. 16, with the shim value set to 0 mG cm$^{-1}$. Spectrum 400b of FIG. 17 is provided with the shim value set to generate a gradient of 12 mG cm$^{-1}$. Also in FIG. 17, spectrum 400c is provided with the shim value set to generate a gradient of 24 mG cm$^{-1}$, and spectrum 400d is provided with the shim value set to generate a gradient of 48 mG cm$^{-1}$.

Each peak is shifted to a position given by $\delta^i_{shift}=\delta^i_{iso}+\gamma \times G_z \times z_i$; where $z_i$ is the vertical position of the i-th coil, $\gamma$ is the gyromagnetic ratio, and G$_z$ is the strength of the gradient. G$_z$ can be expressed as k×Z1; where k is a gradient strength calibration constant which depends on the shim hardware and is relatively constant for all four coils. It can be seen that some of the peaks (water and methanol) move downfield, and some more upfield (acetonitrile and t-butanol) depending on the sample location relative to the gradient. Note that the overlapping OH peaks appearing at 4.7 ppm in spectrum 8a are resolved by applying the gradient. For this experimental set-up, k was determined to be about 0.012 mG cm$^{-1}$Z1$^{-1}$. Along with the frequency shift, there is a concomitant increase in the line width since missetting Z1 from its optimal value introduces an inhomogeneous field across each sample. The magnitude of this broadening is on the order of G$_z$×d; where d is the diameter of the capillaries. In these experiments, the broadening is roughly 25% of the observed shift introduced by the applied gradient and is in agreement with the physical dimensions and separation of the capillary samples.

The spectra were phased using Varian's VNMR software and converted to a text file using a translation program written in C. The spectral text file was then transferred to a PC form of processor 119 for analysis. A program was written to perform each of the first two analysis methods described above, and used as input: the number of coils, the frequency shift ($\Delta\delta^i$) for each coil arising from the applied field gradient, the digital resolution, and a threshold value for peak-picking, as well as the two spectra. Use of procedure 310 resulted in correct peak assignments for all the peaks from the four samples.

Figure 18:
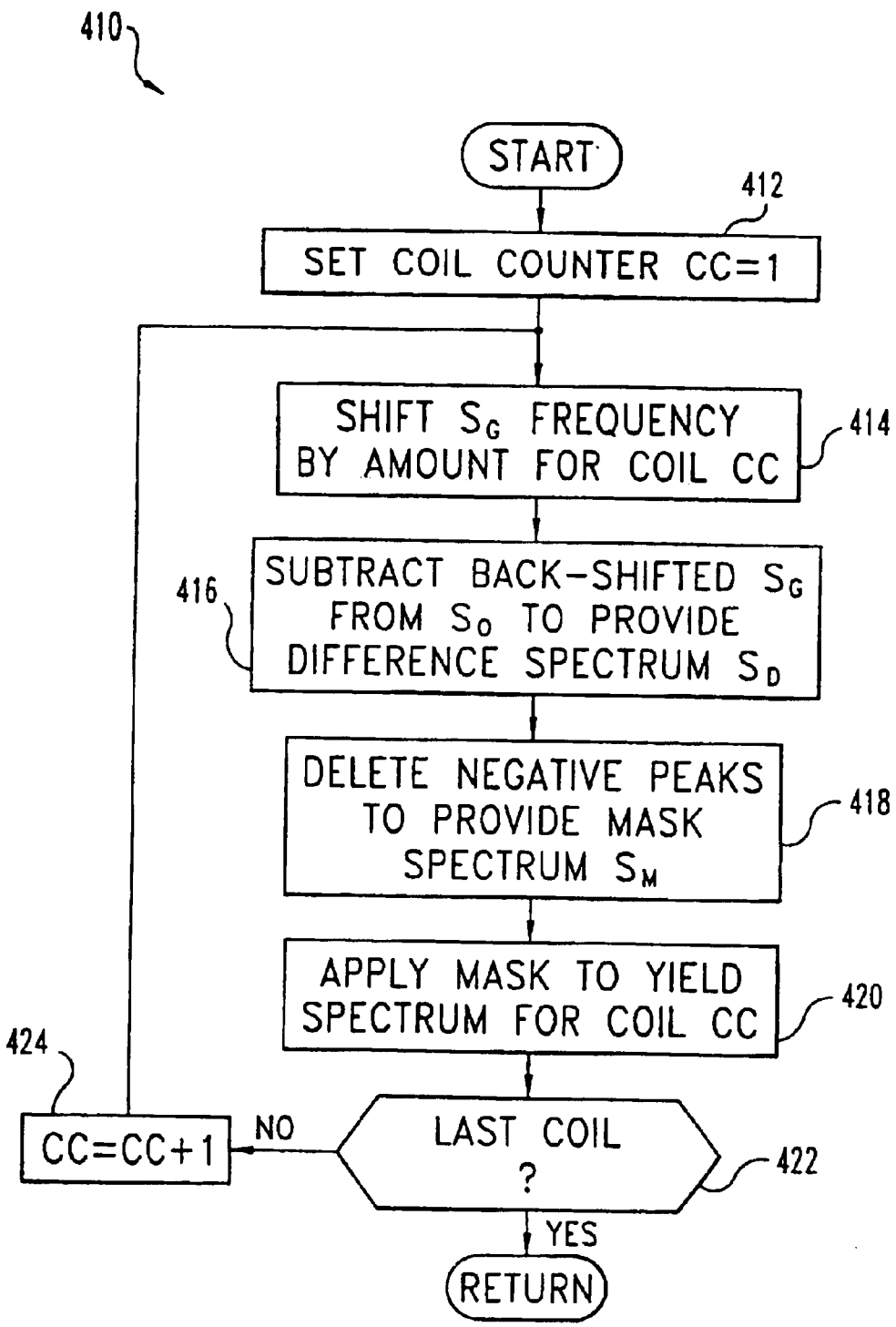
FIG. 18 is a flow chart of another procedure for determining sample-specific spectra for the process of FIG. 9.

The flow chart of FIG. 18 depicts procedure 410 of yet another technique for differentiating the combined spectrum of different samples 134 in probe device 120. As in the case of earlier described procedures associated with the execution of stage 230 of process 210, processor 119 may be partially or completely programmed to execute procedure 410. Procedure 410 begins with stage 412 which sets the coil counter CC to 1 (CC=1). Procedure 410 then continues with a processing loop starting with stage 414. In stage 414, the S$_G$ spectrum is back-shifted by the previously determined frequency shift for the currently indexed coil CC as determined for the magnetic field gradient applied. This back-shifted spectrum is designated as spectrum S$_B$. In stage 416, the back-shifted spectrum S$_B$ is subtracted from the original spectrum S$_0$ to provide a difference spectrum S$_D$. Generally, the difference spectrum S$_D$ corresponds to spectral information from samples 134 of all coils 130 except the currently indexed coil CC of interest. In stage 418, negative peaks with an absolute magnitude exceeding an empirically determined threshold, such as the baseline average, are set to zero to provide a mask spectrum S$_M$. Proceeding with stage 420, the mask spectrum S$_M$ is applied to the baseline spectrum S$_0$ to cancel all peaks contributed by samples 134 except for the sample 134 of interest in the coil 130 indexed as coil CC.

Procedure 410 continues with conditional 422. Conditional 422 tests whether the currently indexed coil CC is the last coil. If the test of conditional 422 is negative, then procedure 410 continues with stage 424 to increment the coil counter CC to the next coil. Procedure 410 then loops back to stage 414 to re-execute stages 414, 416, 418, and 420 with the new coil index CC. Once the processing loop has been executed for each coil 130, then the test of conditional 422 is true. Correspondingly, after procedure 410 has differentiated each sample spectrum from the S$_0$ and S$_G$ spectra, it halts.

Figure 19:
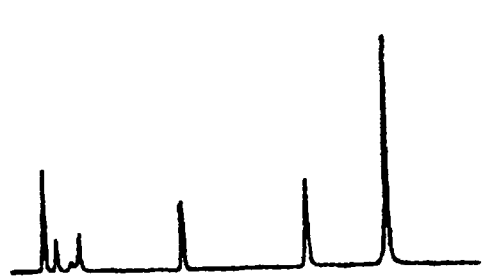
FIGS. 19–22 depict selected stages of the procedure of FIG. 18 as applied to the samples of FIG. 17.
Figure 20:
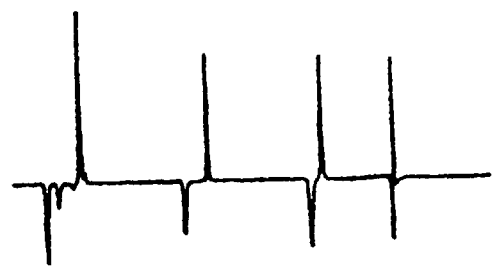
Figure 21:
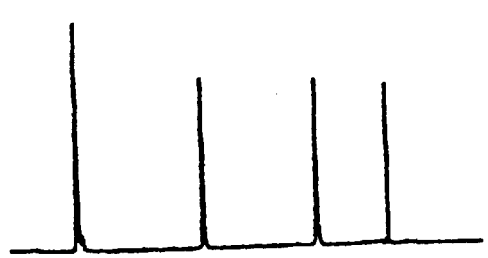
Figure 22:
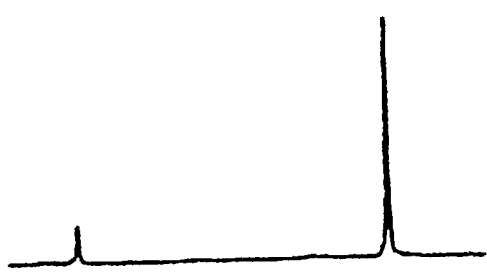

An experimental example of procedure 410 is depicted in connection with FIGS. 19–23 for the separation of the spectrum for the t-butanol sample. For this example, the S$_0$ spectrum is the spectrum of FIG. 16 with a Z1 shim of about 0 mG/cm (also spectrum 400a of FIG. 17) and the S$_G$ spectrum is spectrum 400d of FIG. 17. For this gradient component, the shifts $\Delta\delta^i$ for the four coils were 40.0 Hz (methanol), −10.0 Hz (acetonitrile), −61.1 Hz (t-butanol), and 91.0 Hz (water). The experimental set-up for the experimental example of procedure 410 is otherwise as provided for the experimental example described in connection with procedure 310. In correspondence with stage 414 of procedure 410, the program for processor 119 starts by shifting each point "n" in the shifted spectrum S$_G$ to $\delta_n^i-\Delta\delta^i$; (where $\delta_n^i$ is its original position in the second spectrum, and $\Delta\delta^i$ is the expected shift for the i-th coil). FIG. 19 is a diagram of the resulting back-shifted spectrum S$_B$ obtained by shifting spectrum 400d by the predetermined frequency shift. FIG. 20 is a diagram of a different spectrum S$_D$ obtained by subtracting the back-shifted spectrum S$_B$ of FIG. 19 form spectrum 400a in accordance with stage 416 of procedure 410. As can be observed, two of the peaks for the sample of interest (t-butanol) cancel one another while the peaks from the other coils are inverted. FIG. 21 is the mask spectrum S$_M$ obtained by setting all negative peaks appearing in the difference spectrum S$_D$ of FIG. 20 with an absolute magnitude greater than or equal to the baseline average to zero per stage 418 of procedure 410. FIG. 22 is a diagram of the differentiated spectrum obtained by subtracting the mask spectrum S$_M$ of FIG. 21 from the baseline spectrum 400a as described in connection with stage 420 of procedure 410. In this case, the resulting spectrum contains only peaks due to the t-butanol sample.

Figure 23:
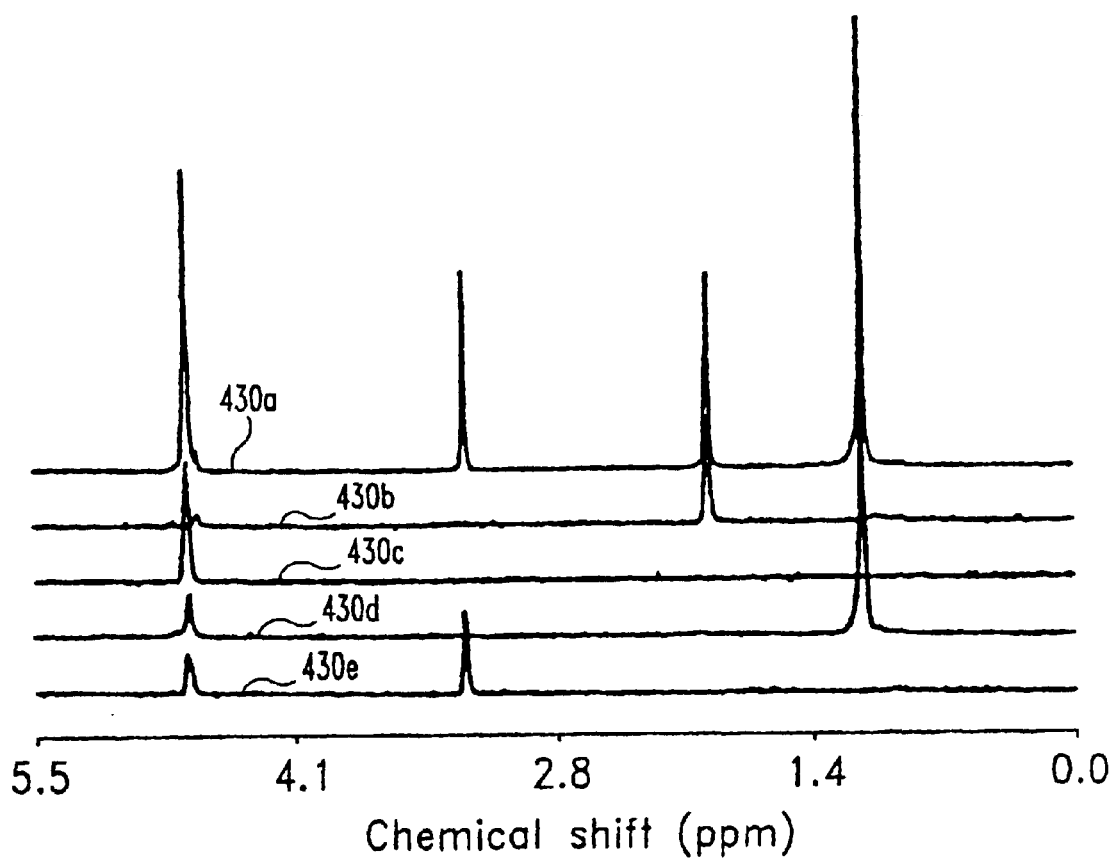
FIG. 23 depicts the differentiated sample spectra obtained with the procedure of FIG. 18.

Referring to FIG. 23, the differentiated sample-specific spectra determined from spectra 400a and 400d with procedure 410 are illustrated. In FIG. 23, spectrum 430a is the same as the composite spectrum 400a of FIG. 17 and the spectrum shown in FIG. 16. Spectrum 430b of FIG. 23 is for the acetonitrile sample (peak at 1.9 ppm). Spectrum 430c of FIG. 23 is for the water sample water (peak at 4.7 ppm). Spectrum 430d of FIG. 23 is for the t-butanol sample (peaks at 4.7 ppm and 1.1 ppm). Spectrum 430e of FIG. 23 is for the methanol sample (peaks at 4.7 ppm and 3.2 ppm).

Still another technique to differentiate a composite NMR spectrum of different samples is to apply reference deconvolution. Reference deconvolution is performed by multiplying the experimental time-domain data (Free Induction Decay data or "FID") by the complex ratio "R" of an ideal FID and a reference FID. This procedure can also be incorporated into programming for processor 119. The reference FID is constructed from the experimental spectrum by zeroing all parts of the experimental spectrum except those containing the well-resolved reference signal and taking its inverse Fourier transform. The ideal FID is similarly generated by placing a single point (delta function) at the peak of the reference signal and zeroing the rest of the spectrum, followed by inverse Fourier transformation. The corrected experimental FID is calculated by multiplying the experimental FID by R, and Fourier transformation yields the corrected FID.

Reference deconvolution is easily incorporated into procedure 410. In one implementation, both spectra $S_0$ and $S_G$ were deconvolved to the same line width prior to performance of procedure 410. Because of possible nonuniform line-broadening across the detection coils 130, use of a standard for each coil is advisable. Typically, for desired performance, such a standard should include reference peak(s) from each coil that are well separated from the rest of the composite spectrum and may be run with the samples or separately.

Figure 24:
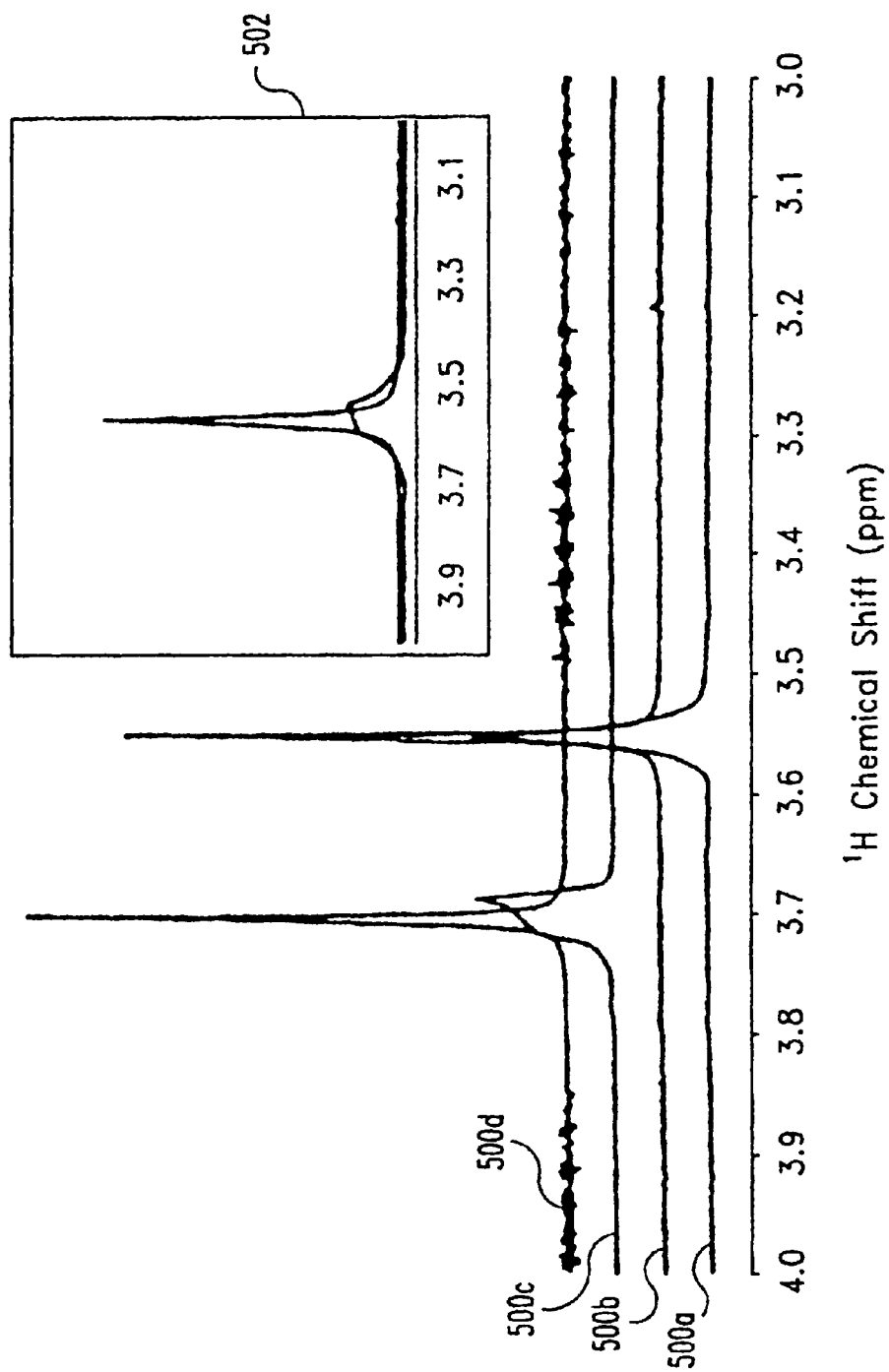
FIG. 24 depicts comparative stages of reference deconvolution for a methanol spectral peak.

FIG. 24 demonstrates the effect of applying a reference deconvolution to both the $S_0$ and $S_G$ spectra prior to procedure 410 execution for a methanol peak. The original peak in the $S_0$ spectrum 500a has a much narrower line width than the same peak in the $S_G$ spectrum 500c with the applied gradient. After both $S_0$ and $S_G$ were deconvoluted to Lorenztian line shapes with 2 Hz linewidths, as shown in spectra 500b and 500d, respectively, it is apparent that their intensities match much better. As can be seen from these results, reference deconvolution facilitates conversion of the broad asymmetric peaks in $S_G$ to peaks with line shapes that more closely resemble those in $S_0$. The inset 502 of FIG. 24 compares the results of applying procedure 410 to the methanol portion of the data set with and without reference deconvolution.

Figure 25:
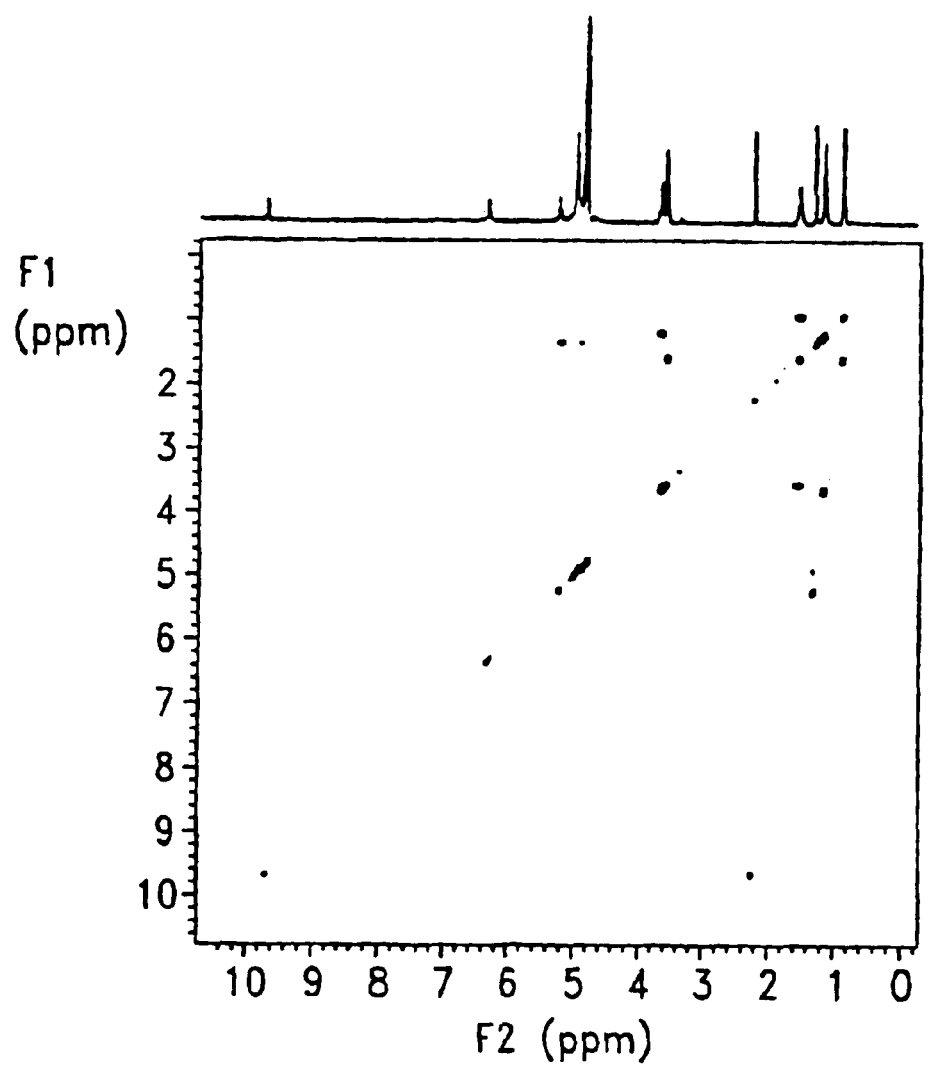
FIG. 25 depicts a 2D COSY spectrum of samples of 0.50 M ethanol, 1-propanol, dichloroacetic acid, and acetaldehyde in D$_2$O without a magnetic field gradient.

To Improve the separation of more complex sample spectra from a composite spectrum representative of multiple samples multidimensional NMR techniques may be incorporated into stage 230 of process 210 (FIG. 9) in other embodiments of the present invention, including, but not limited to two-dimensional (2D) Correlated Spectroscopy (COSY). By spreading out the resonances into two or more dimensions, highly dense one demensional (1D) spectra can be considerably simplified. In correspondence with one experimental example, FIG. 25 shows the COSY spectrum of 0.50 M 1-propanol, dichloroacetic acid, ethanol, and acetaldehyde in $D_2O$ each loaded into a different sample coil. This composite spectrum was acquired with a substantially homogeneous magnetic field in correspondence with stage 214 of process 210. The spectrum shows a number of well resolved peaks, including five cross peaks. Several of the OH peaks are missing because they have exchanged with the deuterated solvent.

Figure 26:
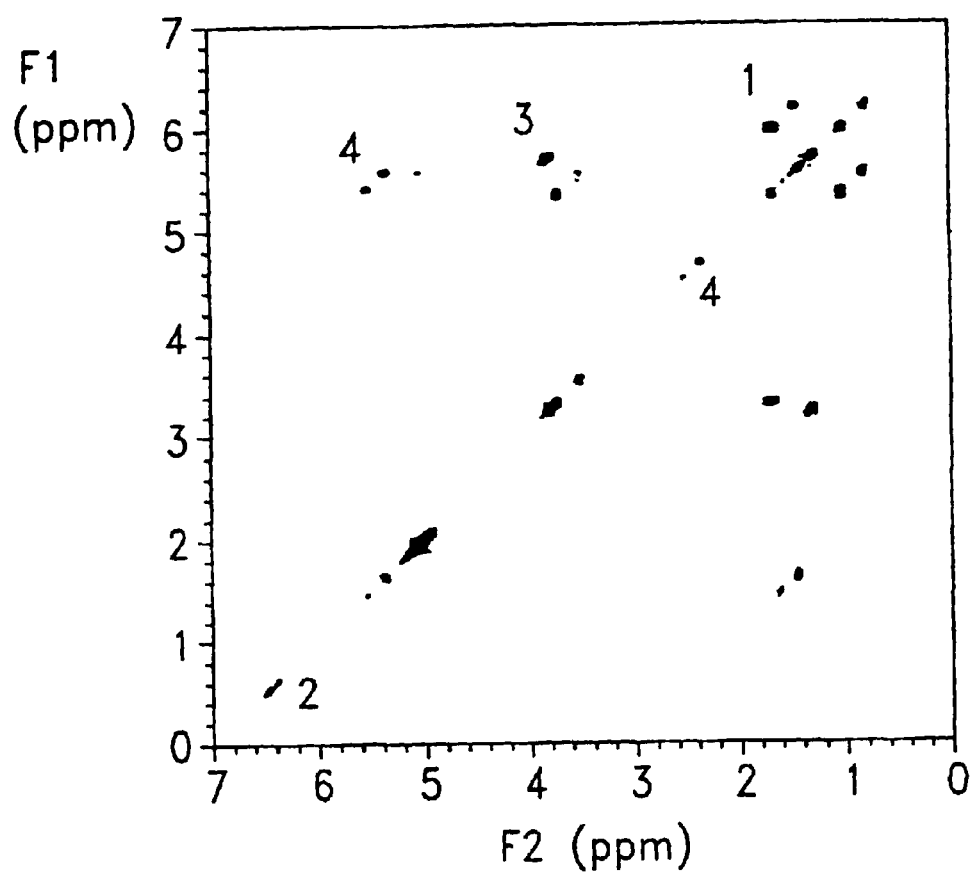
FIG. 26 depicts the 2D COSY spectrum of FIG. 25 overlaid with a gradient shifted spectrum.

In FIG. 26, an overlap of unshifted and gradient shifted spectra in the region of 0–7 ppm for both dimensions using the same samples is shown. Labeling the coils sequentially from top (coil 1) to bottom (coil 4), coil 1 resulted in peaks that are highly shifted upfield (by about 57 Hz). The coil 2 peaks are also shift upfield (by about 27 Hz) The coil 3 peaks are shifted somewhat downfield (by about 12 Hz), while the coil 4 peaks are shifted further downfield (by about 51 Hz). For this case, the analytes can be assigned to their corresponding coils directly from the two 2D spectra superimposed in FIG. 25. For example, the analyte in coil 1 contains three diagonal peaks at 1.0, 1.7, and 3.7 ppm along with two corresponding cross peaks, and is identified as 1-propanol. Note that the OH resonance and corresponding cross peaks are missing due to its exchange with the $D_2O$ solvent. The coil 2 peak at 6.5 ppm contains no cross peaks, and are identified as dichloroacetic acid. From the coil 3 peaks appearing at 1.3 and 3.8 ppm and the corresponding cross peaks, this sample can be identified as containing ethanol. The coil 4 sample includes diagonal peaks at 2.4 and 9.8 ppm, as well as two corresponding cross peaks that were identified as acetaldehyde. In addition, there are two other diagonal peaks at 1.5 and 5.4 ppm, and their cross peaks. Since these peaks are shifted by the same amount and in the same direction as the acetaldehyde peaks, this species must originate from the same coil. The chemical shift of these peaks are identical to the literature values of 2,4,6-trimethyl-s-trioxane, $(CH(CH_3)O)_3$, which is a polymer of acetaldehyde, and which constitutes an impurity. The final assignments are: propanol coil 1; dichloroacetic acid in coil 2; ethanol in coil 3; and acetaldehyde with an impurity in coil 4.

It is also possible to use the multiplication algorithm to generate separate 2D sub-spectra, as was the case for the spectra described in connection with FIG. 14. In accordance with this procedure, spectrum $S_G$ is frequency shifted for each coil and multiplied with the original spectrum $S_0$ according to equation (3) as follows:

$$S^i(\omega_1, \omega_2) = S_0(\omega_1, \omega_2) \times S^i_G(\omega_1 + \Delta_i, \omega_2 + \Delta_i) \qquad (3)$$

Due to the high density of peaks along the diagonal in the 2D COSY spectra, there may be significant overlapping of peaks between the back-shifted and the original spectra that gives rise to spurious peaks along the sub-spectra diagonal. This high level of congestion along the diagonal in 2D spectra would make it difficult to rely on these peaks for coil assignment. However, by instead using the cross peaks, advantage may be taken of the generally higher resolution inherent in this type of multidimensional NMR. The diagonal peaks of $S^i$ are suppressed in accordance with equation (4) as follows:

$$S^i(\omega \pm \delta, \omega \pm \delta) = 0 \qquad (4)$$

Figures 27, 28:
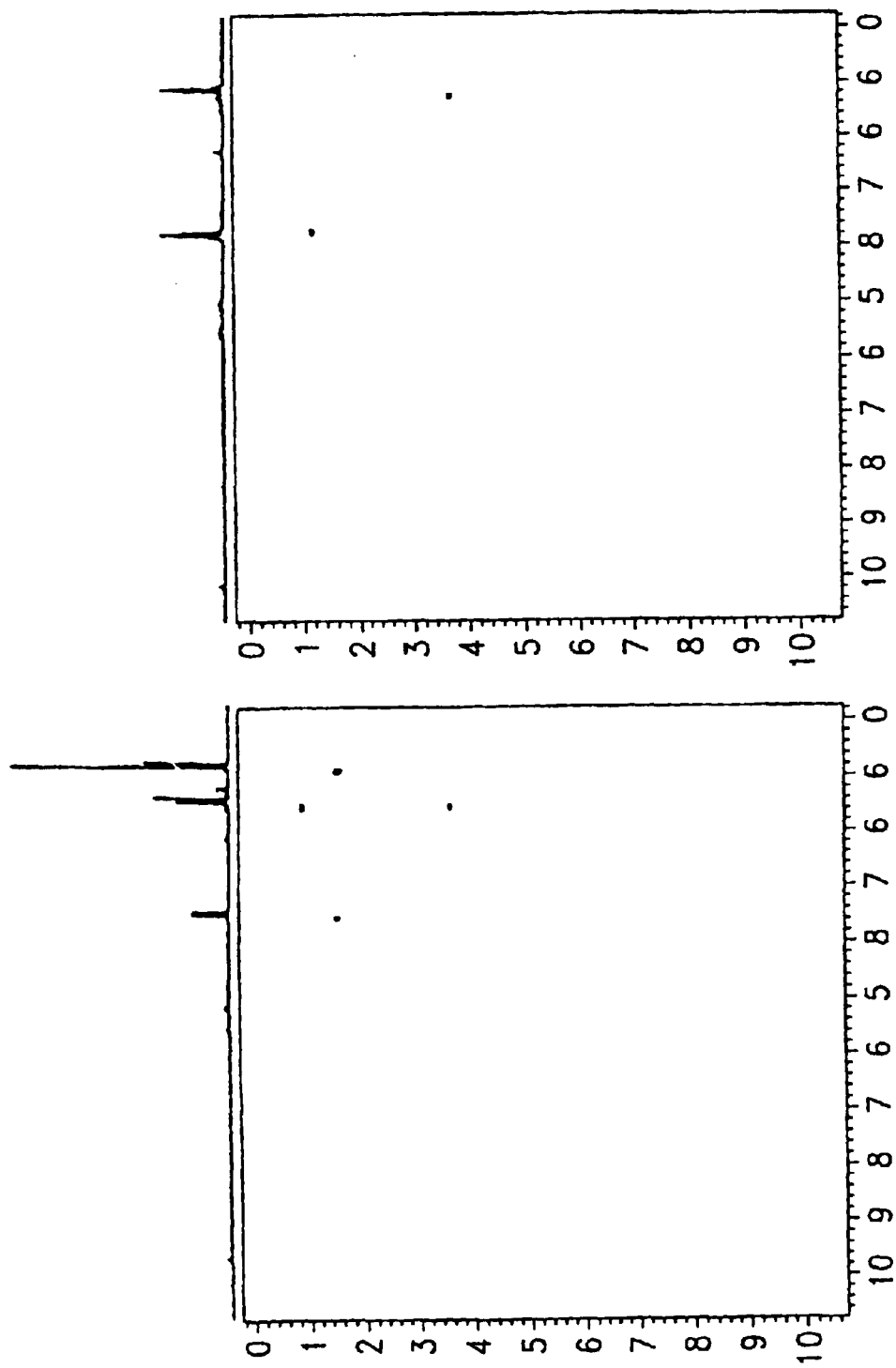
FIG. 27 depicts a separated 2D COSY sub-spectrum for 1-propanol generated from the gradient shifted and unshifted spectra of FIG. 26.
FIG. 28 depicts a separated 2D COSY sub-spectrum for ethanol generated from the gradient shifted and unshifted spectra of FIG. 26.

This technique sets all the peaks within the bandwidth, δ, of the diagonal to zero, which does not affect off-diagonal peaks as long as δ is smaller than the smallest J-coupling observed in the spectrum. Now the spectrum consists of only the cross peaks from samples in the ith coil. The results of this procedure are shown in FIGS. 27 and 28 for two sub-spectra corresponding to 1-propanol and ethanol, respectively.

One alternative method is to apply pulsed field gradients during a portion of the NMR experiment. For example, a small pulsed field gradient applied during the acquisition time (t2) of the COSY experiment will result in a 2D spectrum in which the separate samples are shifted in frequency along a single frequency axis, in this case F2. Alternatively, large pulsed field gradients can be used to generate subspectra in a different manner. A large pulse field gradient will shift the sample spectra into completely different frequency ranges such that individual spectra corresponding to the individual samples can be obtained directly. This is accomplished by the application of a large pulsed field gradient in conjunction with frequency selective RF excitation pulse that excites only a single sample by taking advantage of the unique frequency shift provided by the applied field gradient.

Figure 29:
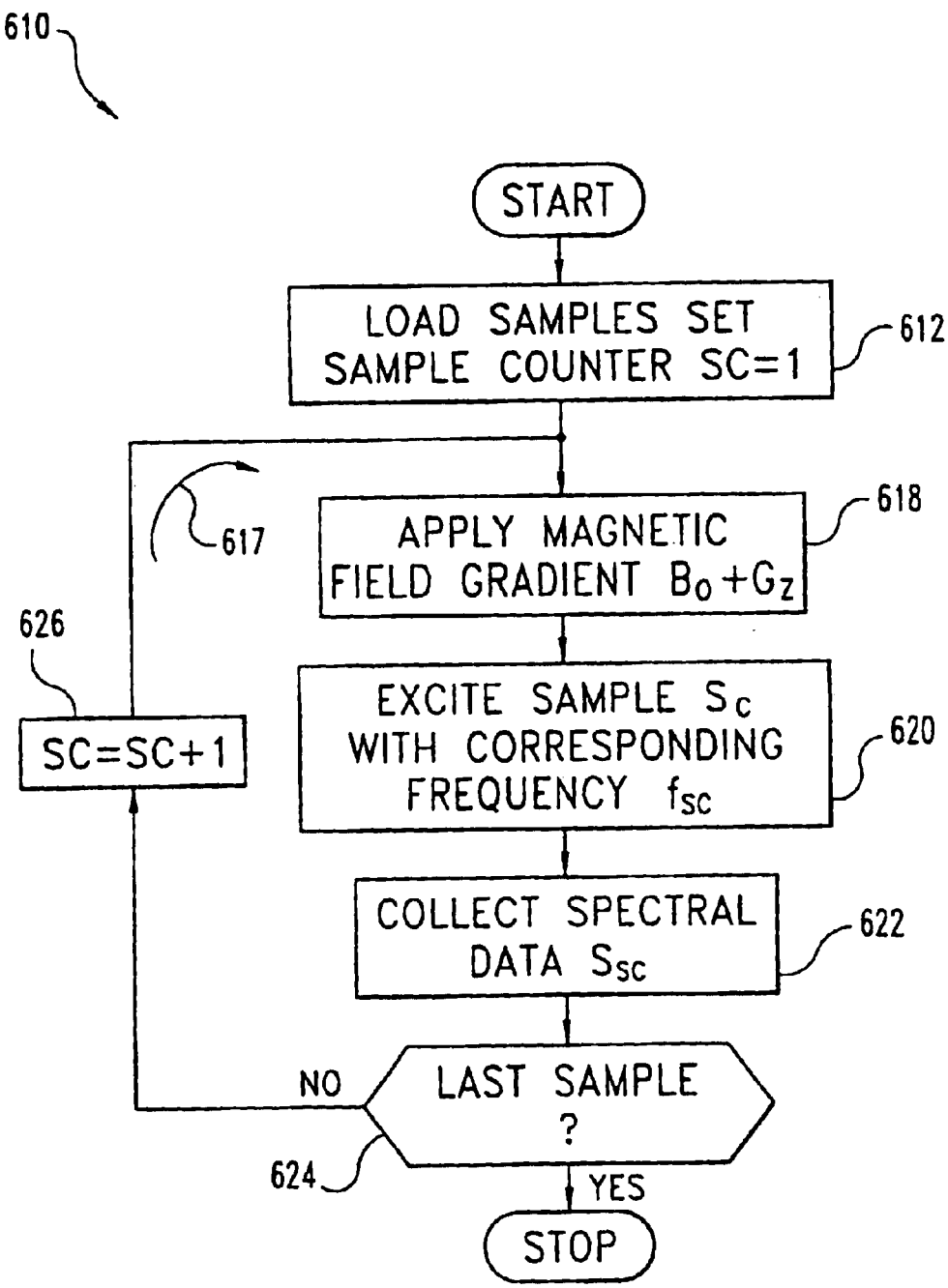
FIG. 29 is a flow chart of a further process for operating the system of FIG. 6.

The flow chart of FIG. 29 depicts process 610 for determining sample-specific spectra from a composite spectrum. In stage 612 of process 610 samples 134 are loaded into samples holders 132 disposed within coils 130 and sample counter SC is set to 1 (SC=1) with probe device 120 being disposed within sample space 115.

From stage 616 processing loop 617 is entered beginning with stage 618. In stage 618 a magnetic field with gradient component $G_z$ is applied. Typically, the magnitude of this gradient is sufficient to provide a sample region frequency shift large enough to separate each sample into a different frequency range. In one nonlimiting example, for a spectral bandwidth of 6000 kHz (10 ppm for a 600 MHz magnet) and a coil separation of about 5 mm, a field gradient of 3 gauss/centimeter would be sufficient to provide the desired separation. Accordingly, in stage 620, an excitation signal of frequency for $f_{SC=1}$ is provided to excite the indexed sample SC=1. The corresponding spectral data is gathered as spectrum $S_{SC=1}$ in stage 622. Referring additionally to the diagram of FIG. 30, the "with gradient" row provides a schematic illustration of sample spectrum $S_{SC=1}$ at excitation frequency $f_{SC=1}$. For comparison, the "no gradient" row includes a schematic of the composite spectrum $S_0$ for excitation frequency $f_0$ that would be obtained for a unshifted magnetic field $B_0$.

Figure 30:
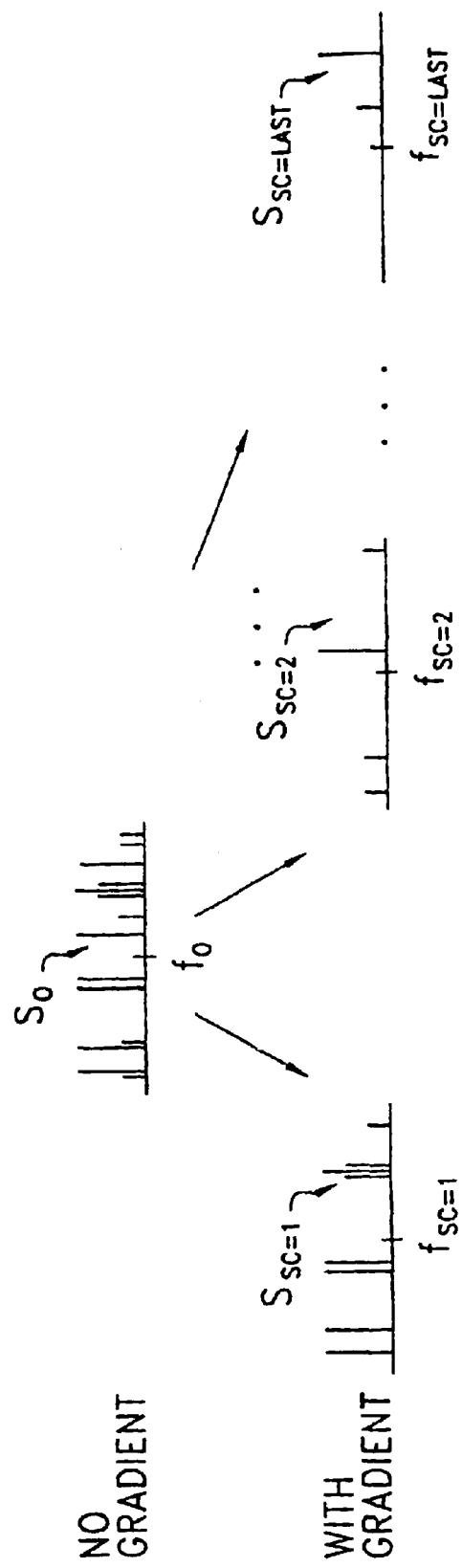
FIG. 30 is a diagram of spectral results illustrative of the process of FIG. 29.

Process 610 proceeds to conditional 624 to determine if the last sample has been interrogated. If the last sample has not been interrogated, processing loop 617 continues with stage 626. In stage 626 the sample counter SC is incremented to point to the next sample (SC=2), then process 610 continues with stage 618, 620, and 622. During this execution of stage 620, a different excitation frequency $f_{SC=2}$ is applied corresponding to the new sample SC=2. The second entry on the "with gradient" row of FIG. 30 provides a schematic illustration of sample spectrum $S_{SC=2}$ at excitation frequency $f_{SC=2}$.

The execution of stages 618, 620, and 622 continues for each remaining sample (SC=3 to SC=LAST), where LAST=4 for the probe device 120 embodiment. Once execution of loop 617 for the last sample 134 is complete, process 610 terminates with from the affirmative branch of conditional 624. Because each execution of processing loop 617 excites only a single sample, it can be repeated at a rate faster (typically one or more per second) than the relaxation time (typically 10 seconds), permitting a fast sequence of data collection for each sample group. As the diagram of FIG. 30 illustrates, the application of a gradient sufficient to separate each sample in terms of frequency provides a surprising way to decompose a composite spectrum (i.e. $S_0$) of multiple samples. In one embodiment, one or more gradient field coils dedicated to spectra separation are included in system 210 (not shown) to provide desired field gradient qualities for process 610. In other embodiments, different gradient field sources and/or control arrangements may be utilized.

Processes 210, 610 and procedures 310, 410, 510 described in connection with system 110 may be combined, substituted, rearranged, reordered, deleted and altered as would occur to those skilled in the art for an application of interest. Moreover, for process 210, the first magnetic field $B_0$ provided in stage 214 need not be substantially homogeneous. Instead, in other embodiments, $B_0$ may be a known gradient difference relative to the field applied in stage 218 that is not homogeneous through sample space 115. Likewise, system 110 and one or more of these processes and procedures may be combined with one or more isolated tuning network/coil combinations described for system 10. In still other embodiments, the sampling parallelism of system may be generally increased as a function of the size of the homogeneous region of the NMR magnet. In one example, for a 7.05 T wide-bore magnet, this region extends over 20 mm. In an example having microcoils capable of acquiring high-resolution data with outer diameters on the order of 350 micrometers ($\mu$m), and accounting for any broadening upon application of the gradient, the minimum coil spacing should be on the order of the coil diameter. These parameters allow for at least 10 microcoils to be located in the 20 mm region of the magnet. Such a probe would provide for a corresponding 10-fold reduction in throughput, which in conjunction with flow-through samples, would represent a significant advance in high-throughput screening compared to conventional single sample NMR techniques.

Figure 31:
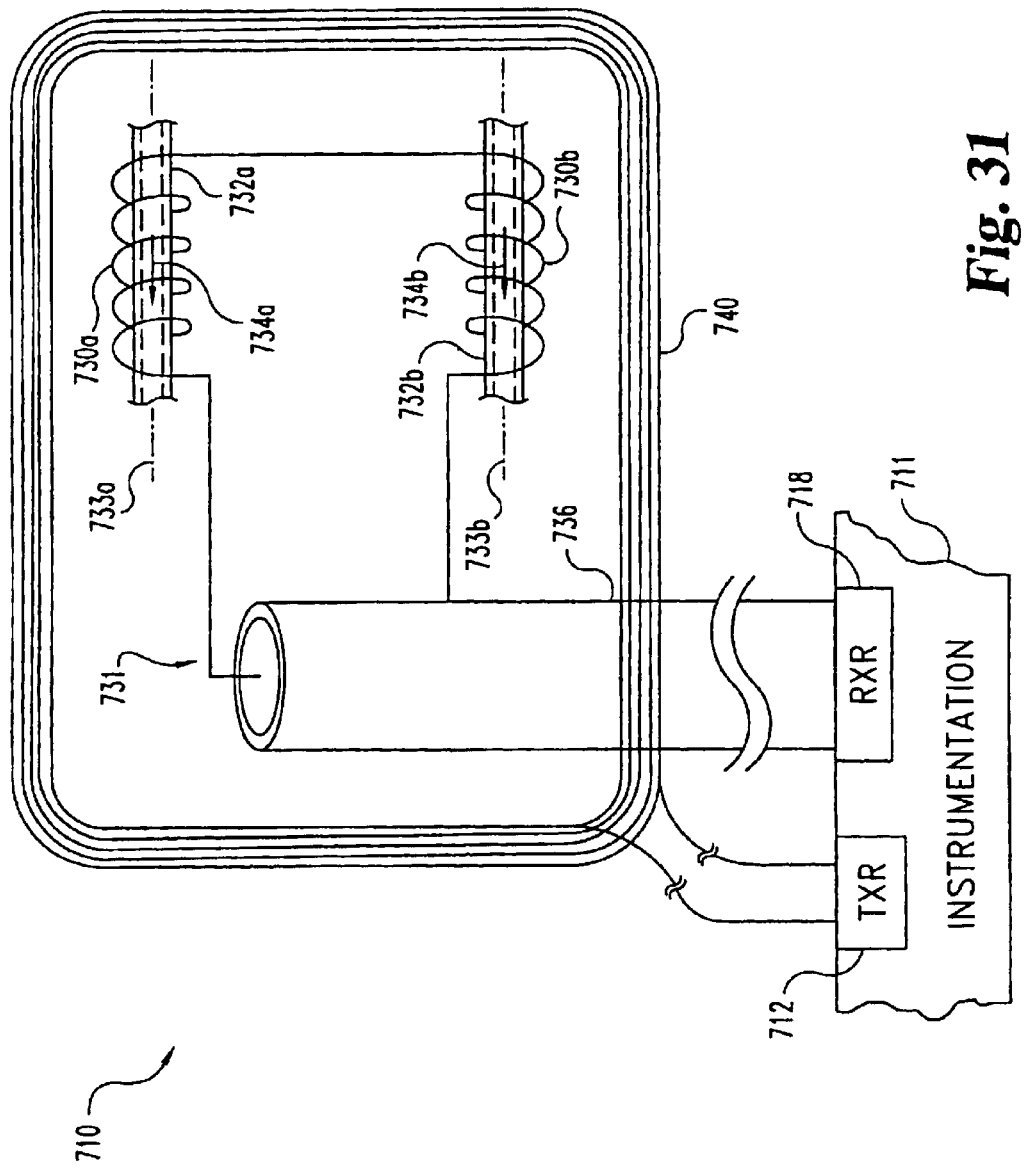
FIG. 31 is a partial schematic view of a NMR system of a further embodiment of the present invention.

FIG. 31 provides a schematic view of NMR system 710 of another embodiment of the present invention. System 710 includes NMR instrumentation 711 with RF excitation transmitter (TXR) 712 and NMR receiver (RXR) 718. Receiver 718 is coupled to probe network 731 by transmission line 736. Network 731 includes coils 730a, 730b each disposed about sample holder 732a, 732b, respectively. Each sample holder 732a, 732b is depicted as the "flow-through" type previously described and is configured to receive a corresponding sample 734a, 734b. Coils 730a, 730b are each of a solenoid configuration wound about a corresponding centerline axis 733a, 733b. Coils 730a, 730b are oriented so that centerline axes 733a, 733b are approximately parallel.

RF transmitter 712 of instrumentation 711 is coupled to a separate excitation coil 740 to provide an RF stimulus signal to samples 734a, 734b. Coil 740 is wound and centered relative to an axis that is generally perpendicular to the view plane of FIG. 31 and axes 733a, 733b. Probe network 731 and excitation coil 740 are arranged to be placed in a magnetic field suitable to perform NMR analysis. For the described orientation of coils 730a, 730b, 740; samples 734a, 734b will be excited generally in-phase with one another by a suitable RF signal from coil 740, as designated by the common direction of the arrows in sample holders 732a, 732b.

It should be understood that coils 730a, 730b are electrically connected to each other in series. Moreover, coil 730a is wired from left to right and coil 730b is oppositely wired from right to left. While samples 734a, 734b in coils 730a, 730b are excited in the same phase with coil 740, the opposite winding pathways of coils 730a, 730b provide a phase offset in relation to corresponding sample response signals provided by coils 730a, 730b. When coils 730a, 730 are substantially similar except for the opposite winding pathway directions, approximately a 180 degree phase difference results, providing at least partial cancellation of any peak common to both samples 734a, 734b.

Figure 32:
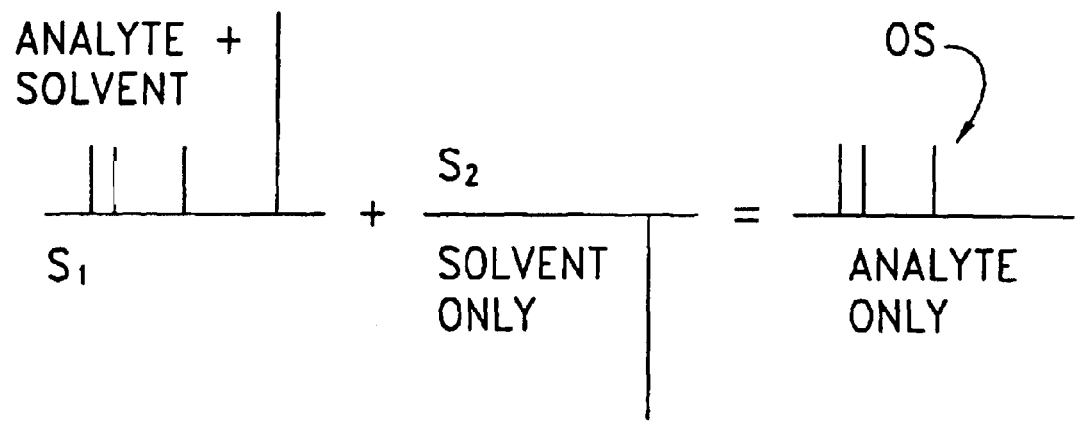
FIG. 32 is a diagram illustrating selected operating characteristics of the NMR system shown in FIGS. 31 and 33.

Referring additionally to the diagram of FIG. 32, selected operation aspects of system 710 are further described. In FIG. 32 spectral response $S_1$ of coil 730a is illustrated that corresponds to the response of an analyte and solvent mixture comprising sample 734a. Also illustrated is spectral response $S_2$ of coil 730b that corresponds to sample 734b consisting of only the solvent of the mixture of sample 734a. Because of the opposite phase orientation of coils 730a, 730b, spectral response $S_2$ is illustrated as a negative peak. Accordingly, by operation of the serial connection between coils 730a, 730b, spectral responses $S_1$ and $S_2$ combine to substantially cancel the opposing responses of the solvent, leaving only the analyte in the observed spectrum OS as illustrated in FIG. 32.

Figure 33:
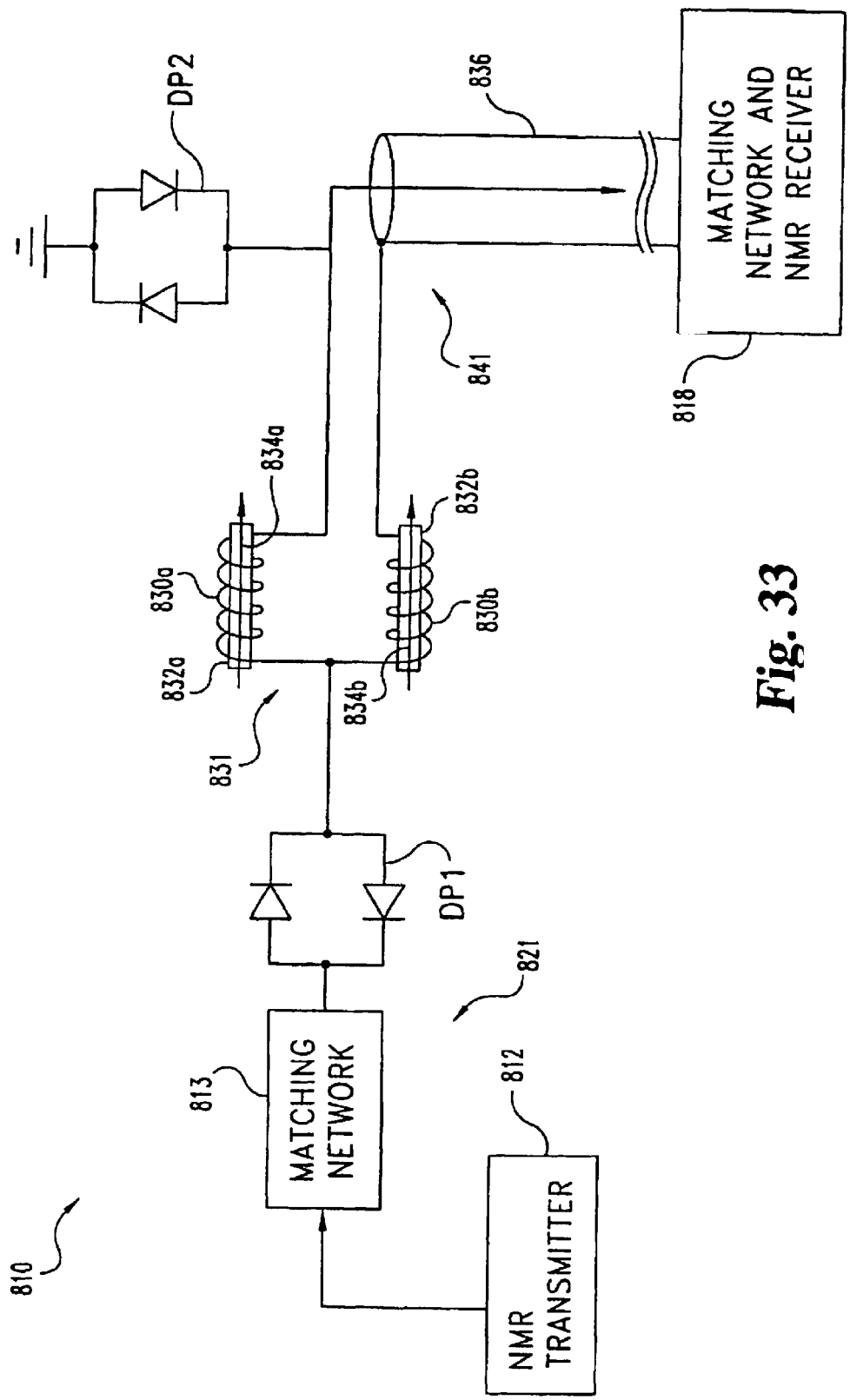
FIG. 33 is a partial schematic view of a NMR system of yet a further embodiment of the present invention.

Referring to FIG. 33, system 810 of another embodiment of the present invention is illustrated. System 810 includes a transmitting network comprised of NMR transmitter 812 to selectively provide an RF excitation signal, a matching network 813, and a crossed diode pair DPI. System 810 also includes probe network 831 arranged for placement in a magnetic field suitable to perform NMR analysis. A receiving network 841 of system 810 includes crossed diode pair DP2 and transmission line 836 that are electrically coupled to probe network 831. Receiving network 841 also includes matching network and NMR receiver 818 that are electrically coupled to transmission line 836 opposite probe network 831.

Probe network 831 includes coils 830a, 830b generally arranged to have mutually parallel longitudinal centerline axes as described in connection with coils 730a, 730b of system 710. Coils 830a, 830b are each disposed about a corresponding sample holder 832a, 832b configured to receive a respective sample 834a, 834b. As in the case of probe network 731, coils 830a, 830b are electrically connected in series to one another with respect to receiving network 841 and also have opposite winding path directions as described for system 710. Accordingly, transmitting network 821 is operable to excite samples 834a, 834b in parallel with an in-phase relationship as symbolized by the arrows in holders 832a, 832b that point in a common direction; however, receiving network 841 is operable to receive the corresponding response from coils 830a, 830b in series. When coils 830a, 830b are substantially similar except for the opposite winding pathway directions, approximately a 180 degree phase difference results providing at least partial cancellation of any resonant frequency common to both samples 834a, 834b.

As explained in connection with FIG. 32, samples 834a, 834b can be selected to reduce the resulting spectral response of constituents common to both samples. Occasionally, a solvent suitable to dissolve an NMR analyte of interest provides undesirable spectral contributions. Advantageously, the ability to attenuate or cancel the spectral contribution of a substance common to both samples for the "antiparallel" coil configurations of systems 710, 810 provides a means to suppress solvent response in a solvent/analyte mixture. As in the case of the previously described systems 10, 110; systems 710, 810 may be adapted to use coils of different geometries. Also, the arrangements of systems 710, 810 may be combined with the probe circuitry of system 10 and/or 110 as would occur to those skilled in the art.

Figure 34:
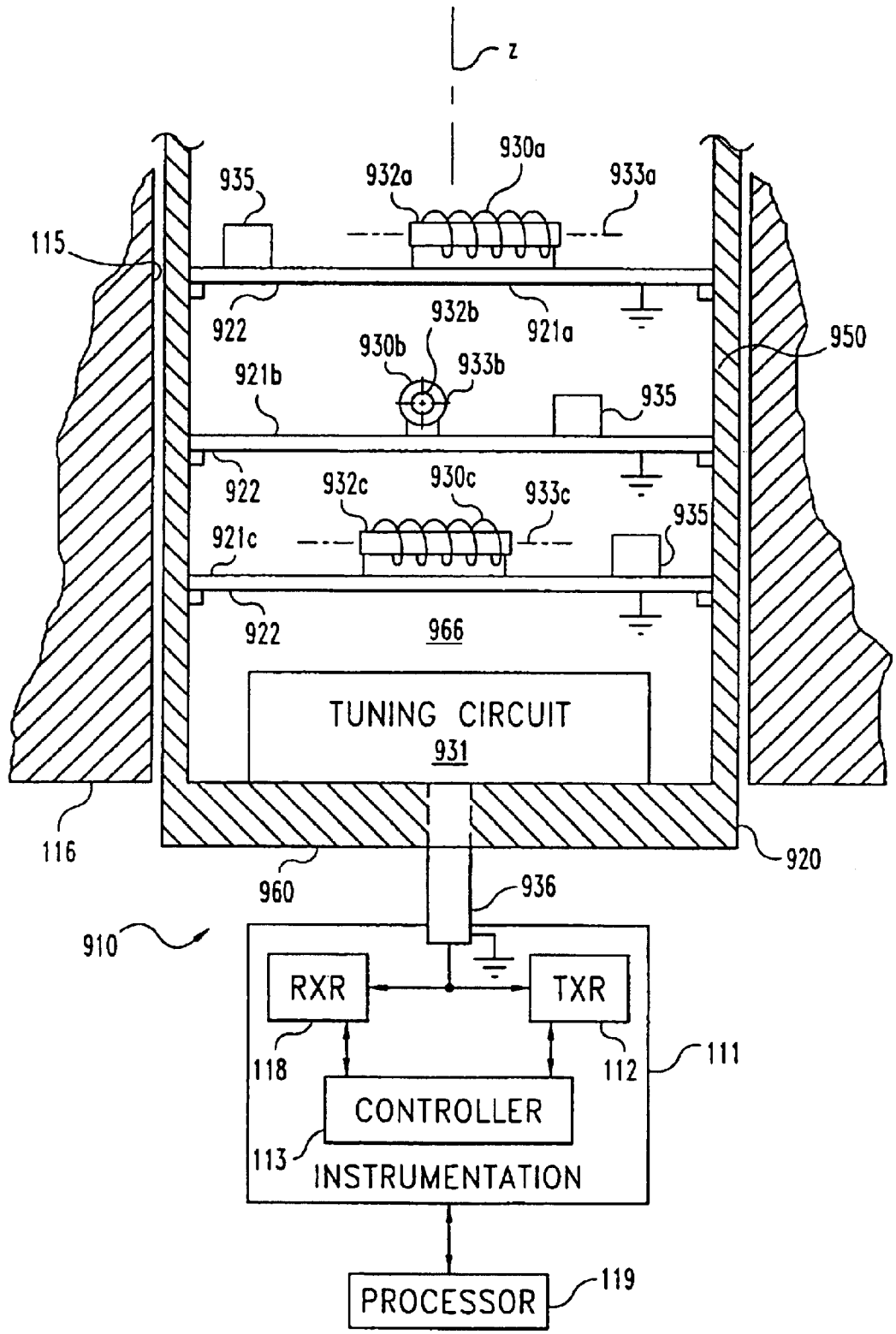
FIG. 34 is a partial diagrammatic view of an NMR system of still a further embodiment of the present invention.

FIG. 34 depicts NMR system 910 of still another embodiment of the present invention. System 910 includes NMR instrumentation 111 with NMR RF transmitter (TXR) 112, controller 113, and NMR receiver (RXR) 118 of the type previously described in connection with system 110 of FIG. 6. Likewise, system 910 includes processor 119 coupled to instrumentation 111 in the manner previously described for system 110. Instrumentation 111 is electrically coupled to probe device 920 by transmission line 936. Probe device 920 is shown in partial section and is disposed in sample space 115 of NMR magnetic field source 116 also previously described in connection with system 110. System 910 may further include sample control instrumentation of the type provided in system 110 (not shown).

Probe device includes housing 950 extending from base 960. Housing 950 defines chamber 966 that contains several printed circuit substrates 921a, 921b, 921c (collectively designated circuit boards 921). Each circuit board 921 includes conductive material 922 electrically connected to ground. Conductive material 922 is arranged to provide suitable electromagnetic shielding between various components mounted on each of circuit boards 921. In one non-limiting example, the side of each circuit board 921 exposed to the components of another of the circuit boards 921 is clad with a copper plating that is grounded to serve as conductive material 922, and provide a corresponding ground plane.

Each circuit board 922 further includes an NMR detection coil 930a, 930b, 930c (collectively designated coils 930), respectively. Coils 930 are each arranged to be disposed about a different sample submitted for NMR analysis analogous to the manner described for samples 134 of system 110; however, coils 930 are each mounted to its respective circuit board 922. Circuit boards 922 further include trimming/tuning components, a few of which are designated by reference numeral 935. Components 935 have selected electrical connections with coils 930 and can be configured to adjust for small differences in coil inductance or resistance. Accordingly, components 935 are commonly in the form of resistors and/or capacitors, but may alternatively or additionally include other types as would occur to those skilled in the art.

Each of coils 930 can be of a solenoid, saddle, or such other coil geometry as would occur to those skilled in the art. A longitudinal centerline axis 933a for detection coil 930a is illustrated that is generally parallel to a longitudinal centerline axis 933c illustrated for detection coil 930c. Axes 933a, 933c are also generally parallel to the view plane of FIG. 34. In contrast, detection coil 930b has a longitudinal centerline axis that is generally perpendicular to the view plane of FIG. 34 as represented by cross hairs designated with reference numeral 933b. Accordingly, axis 933b crosses axes 933a, 933c at approximately right angles (90 degrees). This 90 degree orientation of one coil 930 to the next has been found to further reduce undesirable electromagnetic coupling between adjacent coils. Probe device 920 further includes tuning circuit 931 adjacent probe base 960 that electrically interconnects coils 930 and components 935 to transmission line 936. Coils 930a, 930b, 930c are each disposed about a corresponding sample holder 932, 932b, 932c of the flow-through type (collectively designated holders 932). Samples disposed within holders 932 and coils 930 receive RF excitation signals from instrumentation 111, and corresponding response signals are detected with instrumentation 111 as previously described for system 110.

The arrangement of coils and circuitry in probe device 920 may include more or fewer coils. Alternatively or additionally, dedicated RF excitation coils may be employed in system 910 instead of exclusively relying on coils 930 to perform excitation and detection. Furthermore, more than one coil 930 per circuit board 921 may be included and/or one or more of coils 930 may be configured with a separate, isolated turning network as in the case of system 10. Coils 930 may be configured like the multicoil probe circuit of system 110, system 710 and/or system 810, just to name a few.

Many further embodiments of the present invention are envisioned. For instance, in alternative embodiments, intensity, line width, and/or multiple information may be incorporated in the logic of the various procedures being used to discriminate sample-specific spectra from one or more complicated, overlapping composite spectra. In still other embodiments, data analysis may include linear prediction and digital filtering. Also, alternative embodiments may include fewer or more coils; coils of different geometries; different combinations of systems 10, 110, 710, 810, 910; different combinations of processes 210, 610 and/or procedures 310, 410. In further embodiments, systems and processes of the present invention are adapted to interrogate samples in a solid phase and/or may not include a "flow-through" sampling arrangement. Also, standard sample spinning apparatus may be incorporated into the systems of the present invention using techniques known to those skilled in the art.

In general, the various embodiments of the present invention provide corresponding techniques to simply and cost-effectively increase NMR sample throughput. In embodiments including the investigation of Structure Activity Relationships (SAR) by NMR, one is interested in identifying only the molecules that interact strongly with large proteins. These molecules typically have significantly shorter relaxation times than other, non-interacting molecules. Therefore, by using spectral editing methods to discriminate against the non-interacting molecules, parallel sample coils of the present invention may be used to advantage. In other embodiments, probes are utilized for process monitoring and/or control. Furthermore, the deviations of NMR spectrums from a known standard spectrum may be monitored according to the present invention to identify potential problems. Moreover, the present invention includes embodiments having multi-coil probes for monitoring multiple reactions or processes in parallel.

Other embodiments of the present inventions include applications to a broad range of problems in analytical chemistry. For example, there is a growing need for the rapid analysis of large numbers of compounds in the pharmaceutical industry to identify potential drug candidates. In this area, Heteronuclear Multiple Quantum Coherence (HMQC) techniques can be applied to investigate SAR. S. B. Shuker, P. J. Hajduk, R. P. Meadows, S. W. Fesik, Science 274 (1996) 1531; and P. J. Hajduk, E. T. Olejniczak, S. W. Fesik, Journal of the American Chemical Society 119 (1997) 12257 are cited as sources of additional information concerning HMQC techniques. Parallel NMR analysis will be advantageous in such an application. In another embodiment, for combinatorial chemistry, where large numbers of somewhat similar compounds are quickly synthesized, a rapid NMR analytical method could be desirable. Also, embodiments of the present inventions include coupling the structural determination capabilities of NMR with chromatographic separation techniques such as LC-NMR and CE. Other variations and embodiments of the present invention include utilizing the unique NMR probe designs of the present invention with microcoils, flow-through probes, nano-volume probes and solvent suppression pulse sequences—such embodiments may also include combinatorial synthetic methods and methods to analyze large molecular libraries.

It is contemplated that various operations, stages, conditionals, procedures, routines, and processes described in connection with the present invention could be altered, rearranged, substituted, deleted, duplicated, combined, or added as would occur to those skilled in the art without departing from the spirit of the present invention. As used herein, it should be appreciated that: spectrum, spectra, variable, criterion, characteristic, comparison, quantity, amount, information, value, level, term, constant, flag, data, stage, record, threshold, and limit each generally correspond to one or more signals within processing equipment of the present invention.

All references to experiments and results are intended to be illustrative of the present invention and should not be considered limiting or restrictive with regard to the scope of the present invention. Further, any theory of operation, proof, or finding stated herein is meant to further enhance understanding of the present invention and is not intended to make the scope of the present invention dependent upon such theory, proof, or finding. All publications, patents, and patent applications cited in this specification are herein incorporated by reference as if each individual publication, patent, or patent application were specifically and individually indicated to be incorporated by reference and set forth in its entirety herein. Documents to be incorporated by reference include, but are not limited to: (1) U.S. Provisional Patent Application No. 60/121,869, filed 26 Feb. 1999; (2) Hou, T.; MacNamara, E.; Raftery, D. Analytica Chimica Acta 400 (1999) 297; (3) Fisher, G.; Williams, S.; Raftery, D. Analytica Chimica Acta 397 (1999) 9–16 and (4) Fisher, G.; Pettuci, C.; Raftery D. Journal of Magnetic Resonance, 138 (1999) 160–163. While the invention has been illustrated and described in detail in the drawings and foregoing description, the same is to be considered as illustrative and not restrictive in character, it being understood that only the preferred embodiment has been shown and described and that all changes, equivalents, and modifications that come within the spirit of the invention are desired to be protected.

We claim:

1. An apparatus comprising an NMR robe device, including:

an RF excitation source;

a first sample holder configured to receive a first sample;

a first coil having a plurality of windings disposed around said first sample holder, said first coil detecting a first sample response to an excitation signal from said RF excitation source when said first sample is within said first sample holder;

a second sample holder configured to receive second sample;

a second coil having a plurality of windings disposed around second sample holder, said second coil detecting a second sample response to an excitation signal from said RF excitation source when said second sample is within said second sample holder, said second coil being electrically connected in series with said first coil during detection;

wherein said first coil and said second coil are disposed relative to said RF excitation source in order to provide a phase difference between the first sample response and the second sample response in order to at least partially cancel one or more response components corresponding to a common material located within the first sample and the second sample.

2. The apparatus of claim 1, wherein said first coil and said second coil are geometrically oriented in order to provide a phase difference of about 180 degrees.

3. The apparatus of claim 1, wherein said RF excitation source includes an NMR transmitter coupled to said first coil and said second coil in order to excite the first sample and the second sample in parallel, and further comprising:

a magnetic field source proximate to a sample space configured to receive said probe device; and at least one receiver coupled to said first coil and said second coil.

4. The apparatus of claim 1, wherein said first coil and said second coil are each of a saddle or solenoid configuration.

5. The apparatus of claim 1, further comprising an excitation coil positioned about said first coil and said second coil.

6. The apparatus of claim 1, wherein said first coil and said second coil are each of a microcoil variety with a diameter of less than about 1 millimeter.

7. An apparatus comprising an NMR probe device, including: an RF excitation source;

a first sample holder configured to receive a first sample;

a first coil disposed around said first sample holder, said first coil detecting a first sample response to an excitation signal from said RF excitation source when said first sample is within said first sample holder;

a second sample holds configured to receive a second sample;

a second coil disposed around second sample holder, said second coil detecting a second sample response to an excitation signal from said RF excitation source when said second sample is within said second sample holder, said second coil being electrically connected in series with said first coil during detection; and an excitation coil operably coupled to said first foil and said second coil, wherein said first coil is positioned about a first axis, said second coil is positioned about a second axis, said excitation coil is positioned about a third axis, and wherein said first and second axes are substantially perpendicular to said third axis; and wherein said first coil and said second coil are disposed relative to said RF excitation source in order to provide a phase difference between the first sample response and the second sample response in order to at least partially cancel one or more response components corresponding to a common material located within the first sample and the second sample.

8. A method, comprising:

preparing a first sample comprised of a solvent and a second sample comprised of a mixture of the solvent and an analyte;

placing said first sample in a first sample holder and said second sample in a second sample holder;

placing said first sample holder within a first coil and said second sample holder within a second coil;

exciting the first sample and the second sample to perform NMR analysis of the analyte; and detecting a first sample response with said first coil and a second sample response with said second coil, with said coils being electrically connected in series, the first sample response including a phase difference relative to the second sample response at frequency corresponding to the solvent in order to reduce solvent interference with the NMR analysis of the analyte.

9. The method of claim 8, wherein the phase difference is approximately 180 degrees.

10. The method of claim 8, wherein said exciting includes exposing the first sample and the second sample to an RF signal radiated by an excitation coil disposed about the first coil and the second coil.

11. The method of claim 8, wherein said exciting includes providing an RF signal to the first sample with the first coil and to the second sample with the second coil.

12. An apparatus, comprising an NMR probe device, including:

an RF excitation source;

a first sample holder configured to receive a first sample;

a first coil disposed around said first sample holder, said first coil detecting a first sample response to an excitation signal from said RF excitation source when said first sample is within said first sample holder;

a second sample holder configured to receive a second sample; and a second coil dispose around second sample holder, said second coil detecting a second sample response to an excitation signal from said RF excitation source when said second sample is within said second sample holder, said second coil being electrically connected in parallel with said first coil during excitation, and said second coil also being electrically connected in series with said first coil during detection;

wherein said first coil and said second coil are disposed relative to said RF excitation source in order to provide a phase difference between the first sample response and the second sample response in order to at least partially cancel one or more response components corresponding to a common material within the first sample and the second sample.

13. The apparatus of claim 12, wherein said first coil and said second coil are each of a saddle or solenoid configuration.

14. The apparatus of claim 12, further comprising an excitation coil positioned about said first coil and said second coil.

15. The apparatus of claim 12, wherein aid first coil and said second coil are geometrically oriented in order to provide a phase difference of about 180 degrees.

16. A method, comprising:

preparing first and second samples having a first substance common thereto, the second sample comprising a mixture of the common substance and a second substance;

placing said samples in a probe having a plurality of coils with said first sample in a first sample holder within first coil and said second sample in a second sample holder within a second coil;

exciting the first sample and the second sample in order to perform NMR analysis;

detecting sample responses with said first and second coils being electrically connected in series, said first coil generating a first sample response signal and said second coil generating a second sample response signal;

developing a phase difference in the probe between said first and second sample response signals; and combining differently phased sample response signals in said probe in order to produce a probe output signal in which a spectral component corresponding to the common substance of said first and second samples is at least partially cancelled.

17. The method of claim 16, wherein said exciting includes providing an RF signal to the first sample with the first coil and to the second sample with the second coil.

18. The method of claim 16, wherein the phase difference is approximately 180 degrees.

19. The method of claim 16, wherein said exciting includes exposing the first sample and the second sample to an RF signal radiated by an excitation coil disposed about the first coil and the second coil.

* * * * *